United States Patent
Watanabe et al.

(10) Patent No.: US 7,709,183 B2
(45) Date of Patent: May 4, 2010

(54) METHOD AND DEVICE FOR MANUFACTURING RELIEF PRINTING PLATE TERMINAL FOR SEAMLESS PRINTING

(75) Inventors: Miyoshi Watanabe, Fuji (JP); Tomohiro Kishida, Fuji (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 297 days.

(21) Appl. No.: 10/563,833

(22) PCT Filed: Apr. 30, 2004

(86) PCT No.: PCT/JP2004/005839

§ 371 (c)(1),
(2), (4) Date: Jan. 9, 2006

(87) PCT Pub. No.: WO2005/005147

PCT Pub. Date: Jan. 20, 2005

(65) Prior Publication Data

US 2006/0230964 A1    Oct. 19, 2006

(30) Foreign Application Priority Data

Jul. 9, 2003    (JP) .............................. 2003-272490

(51) Int. Cl.
G03F 7/26    (2006.01)
(52) U.S. Cl. ...................................... 430/302; 101/212
(58) Field of Classification Search .............. 430/270.1, 430/302
See application file for complete search history.

(56) References Cited

U.S. PATENT DOCUMENTS

| | | | |
|---|---|---|---|
| 5,760,880 A | 6/1998 | Fan | |
| 2002/0186294 A1 * | 12/2002 | Torisawa et al. | 347/228 |
| 2002/0187429 A1 * | 12/2002 | Kozaki et al. | 430/302 |
| 2007/0160928 A1 * | 7/2007 | Yamada et al. | 430/270.1 |

FOREIGN PATENT DOCUMENTS

| | | | |
|---|---|---|---|
| EP | 0 362 641 A2 | 4/1990 |
| EP | 1 154 322 A | 11/2001 |
| EP | 1 158 365 A | 11/2001 |
| EP | 1158365 A1 * | 11/2001 |

(Continued)

OTHER PUBLICATIONS

International Preliminary Report on Patentability issued in corresponding international application.

*Primary Examiner*—Mark F Huff
*Assistant Examiner*—Chanceity N Robinson
(74) *Attorney, Agent, or Firm*—Finnegan, Henderson, Farabow, Garrett & Dunner, L.L.P.

(57) ABSTRACT

A workpiece 70 is set to holding rotating means and then liquid-state photosensitive resin 10 is supplied to a resin applying smoothing unit 150 to mold the workpiece 70 into a uniform thickness while rotating the workpiece 70 and applying the liquid-state photosensitive resin 10 to the outer periphery of the workpiece 70 by the resin applying smoothing unit 150. Moreover, while rotating the workpiece 70, liquid-state photosensitive resin, it is exposed by high-intensity ultraviolet light 30 and thereby, the surface of the photo-cured photosensitive resin is shaped to remove an unnecessary resin layer. Then, laser carving is performed by an infrared laser beam 40 to perform post-treatment.

19 Claims, 12 Drawing Sheets

FOREIGN PATENT DOCUMENTS

| | | | |
|---|---|---|---|
| JP | 52-62503 | | 5/1977 |
| JP | 54-121805 | | 9/1979 |
| JP | 54-160442 | | 12/1979 |
| JP | 60-021214 | * | 2/1985 |
| JP | 63-202751 | | 8/1988 |
| JP | 08-300600 | | 11/1996 |
| JP | 153865 | | 6/1999 |
| JP | 2001-179928 | | 7/2001 |
| JP | 3209928 | | 7/2001 |
| JP | 2002-079645 | * | 3/2002 |
| JP | 2002 079645 | | 3/2002 |
| JP | 2003-039848 | | 2/2003 |
| JP | 2003-241347 | * | 8/2003 |
| JP | 2003-241397 | | 8/2003 |
| WO | WO 81/01474 A | | 5/1981 |

* cited by examiner

BUBBLE OR GAS-LIQUID MIXED COMPONENT IS DISCHARGED TO THE OUTSIDE OF SYSTEM

METHOD AND DEVICE FOR MANUFACTURING RELIEF PRINTING PLATE TERMINAL FOR SEAMLESS PRINTING

TECHNICAL FIELD

The present invention relates to a method and an apparatus for manufacturing a relief material for seamless printing using a liquid-state photosensitive resin in manufacturing of a printing form plate for forming a relief image for flexo printing by laser carving, forming a pattern for surface working such as embossing, and selectively applying an infrared laser beam to an original form plate suited to form a relief image for printing such as a tile in accordance with digital image data to directly form an image pattern on the original form plate.

BACKGROUND ART

Flexo printing used for printing a packaging material such as cardboard, paper container, paper bag, or film for flexible packaging, wall paper, construction interior material such as wall paper or decorative plate, or label particularly raises its ratio among various printing methods in recent years.

A printing form plate used for the flexo printing frequently uses a photosensitive resin in general. The photosensitive resin includes a liquid-state resin and solid-state resin form plate formed like a sheet. A photosensitive-resin relief printing form plate on which a relief image is formed through a negative film is obtained by using a process unit dedicated to liquid-state or solid-state form plate and printing is performed by directly attaching the relief printing form plate to a plate cylinder of a printing machine or once attaching the relief printing form plate to a carrier sheet or sleeve for printing and setting the carrier sheet or sleeve for printing to the plate cylinder.

Moreover, for a photosensitive solid-state form plate, a formation (referred to as flexo CTP form plate) (Patent Document 1) for performing exposure through a mask image after forming the mask image by laser drawing by setting a thin removable infrared photosensitive layer (black layer) formed by an infrared laser beam on the photosensitive resin surface instead of using a negative film correspondingly to progress of a recent digital image technique and an external-surface-drum-type drawing apparatus (Patent Document 2) for forming a mask by selectively removing an infrared photosensitive layer of a flexo CTP form plate by an infrared laser beam in accordance with digital image information are disclosed.

In the case of the flexo CTP form plate, relief exposure is performed through the above infrared photosensitive layer mask and exposed photosensitive resin is optically cured. Thereafter, a relief image is formed by washing out unexposed resin by perchloroethylene (1,1,1-trichloroethylene) alone or combining it with alcohol such as n-butanol or carbon-hydride solvent developer such as sorbit (trade mark: produced by McDiarmid) which is a non-chlorine substitute solvent and passes through a drying step and finishing step (photochemical treatment and chemical treatment) to obtain a flexo printing form plate. When winding even this flexo CTP form plate on a plate cylinder, a slight gap is left between the front end and the rear end of the CTP form plate similarly to the case of a normal form plate. Therefore, the flexo CTP form plate is unsuitable for seamless printing.

Therefore, printing of a conventional seamless endless pattern has depended on printing by a gravure form plate or printing by a relief in which an image is formed on a vulcanized rubber roller by manual carving.

In the case of plate making of a gravure form plate, a series of complex steps such as application of a developer to a copper cylinder, exposure, etching, film removal, and chromium plating is performed by using a lot of time. Therefore, the plate making cost is very high. Moreover, to adjust a cell depth, very delicate control is requested for an etching condition. Therefore, operations such as etching and plating are used in a plate making step in addition to an operation depending on the perception of an expert. Therefore, the operations may become a generation source of waste water pollution.

Furthermore, the rubber roller relief by manual carving described above has critical defects that a high level of skill is requested for the plate making technique, a fine design cannot be made because of manual carving, and it is impossible to reproduce a half tone dot.

However, the vulcanized rubber can be used together with a solvent having a strong corrosion characteristic and has a preferable ink transfer characteristic, high elasticity, and high compressibility. Recently, it is possible to obtain a relief printing form plate by directly carving a rubber roller by an infrared laser beam in accordance with a digital image signal instead of manual carving because a digital image processing technique and laser carving technique are advanced.

Commercially-used rubber includes natural rubber and synthetic rubber. As an example of synthetic rubber, there is ethylene-propylene-diene-monomer-elastomer (EPDM). It is possible to provide a flexo printing form plate material which can be carved by a laser beam by using the EPDM. A flexo printing form plate material manufactured from natural rubber or synthetic rubber requires vulcanization by sulfur, sulfur-contained compound, or peroxide in order to perform bridging. Moreover, after the flexo printing form plate material is thus vulcanized, the material requires polishing in order to obtain a uniform thickness and smooth surface suitable for printing. This requires an extreme lot of time and the operability is bad.

Therefore, to solve the above problems, many methods and apparatuses for manufacturing a lot of relief materials for seamless printing to which a photosensitive polymer (liquid-state or sheet-like solid-state resin form plate) widely used in the relief printing field and advantageous for a manufacturing method is applied are proposed.

As a method for setting a printing form plate on a sleeve, a method (Patent Document 3) is known which manufactures a form plate material on which a seamless continuous printing pattern using liquid-state photosensitive resin diluted by a solvent. Patent Document 3 discloses a manufacturing method for rotating an endless raw material, supplying liquid-state photosensitive resin to the rotating surface and smoothing the resin by a doctor.

Moreover, Patent Document 4 discloses a spraying, dipping, and applying roller method or an extruding machine method.

Furthermore, many seamless printing relief manufacturing methods and apparatuses respectively using a photosensitive resin solid-state form plate instead of a liquid-state photosensitive resin are disclosed.

For example, Patent Document 5 discloses a manufacturing method for superimposing a plurality of thermoplastic photosensitive films and winding them on a cylinder, bringing an integrated photosensitive film obtained through pressurizing and heating into accurate dimensions, and then applying the shaping treatment to the film by mechanical compression, grinding, or polishing, and calendar-finishing the film.

Moreover, Patent Document 6 discloses a method and an apparatus for manufacturing a seamless sleeve through rolling and glazing in accordance with a calendar roller method by heating and melting thermoplastic photosensitive resin on the outer periphery of a sleeve supported by a mandrel.

Furthermore, a method for manufacturing a form plate material on which a seamless continuous printing pattern using liquid-state photosensitive resin can be printed is known by the application of the present applicant (Patent Document 7).

In the case of the Patent Document 7, an original form plate for seamless printing is manufactured in accordance with an applying step of supplying liquid-state photosensitive resin to the outer periphery of a cylinder while rotating the cylinder and an exposing step of applying active rays to the applied liquid-state resin layer and forming a resin cured layer. Thereafter, manufacturing method and apparatus for forming a relief image on a resin cured layer of the original form plate for seamless printing by laser carving in accordance with a digital recording signal are disclosed.

Patent Document 8 relates to a blanket for offset printing and discloses a configuration and a structure capable of performing a corresponding step by linearly moving a base sleeve while rotating the base sleeve though a technical field different from the present invention and thereby using individual mechanism set to a fixed position.

That is, manufacturing apparatus and method are disclosed which cut a base sleeve at a desired length by first applying a radioactive polymer by a liquid applicator, smooth the resin liquid surface by an optional surface finisher, then form a polymer cured layer through radiation (preferably, ultraviolet light) exposure, use any one of a scraper, planer, and polisher and thereby smooth the polymer cured layer.

As a liquid applicator, a blade, roller, nozzle, spray, and anilox roll are listed which are generally-used publicly-known techniques and a surface finisher only lists a doctor blade, scraper, planning machine, and polisher which are also general publicly-known techniques. Therefore, portions in which the invention of Patent Document 8 seems to have novelty compared to an preceding invention or conventional publicly-known technique are the following two points (1) and (2).

(1) Continuous treatment is performed by rotating and linearly moving a base sleeve by setting a treatment mechanism to a fixed position.

(2) A mechanism for cutting a base sleeve at a desired length is included.

In the case of the embodiment of the Patent Document 8, the following steps are illustrated: a step of rotating and linearly moving abase sleeve, a step of applying a radioactive curing polymer to the base sleeve in a spiral mode by a spray mechanism, ten smoothing the base sleeve by a first-stage circular smoothing station, a step of forming a polymer cured layer through the exposure by an ultraviolet light source, a step of smoothing the polymer cured layer at a second-stage circular smoothing station same as the first stage, and a step of forming a second polymer layer on the polymer cured layer by a second spray mechanism.

Details of steps after the second poly layer are unknown because a corresponding mechanism is not illustrated. However, judging from the context of this embodiment, a method and an apparatus are illustrated which are estimated as the fact that a first-stage smoothing step, an ultraviolet exposing step, and second smoothing step are continued similarly to the case of the first polymer layer.

Patent Document 1: JP11-153865A
Patent Document 2: JP8-300600A
Patent Document 3: JP52-62503A
Patent Document 4: West Germany Patent Application Laid-Open No. 2640105 (Specification)
Patent Document 5: JP63-202751A
Patent Document 6: Japan Patent No. 3209928
Patent Document 7: JP2002-079645A
Patent Document 8: JP2003-29848A However, there are the following problems in the above-described conventional method and apparatus for manufacturing a relief material for seamless printing.

To obtain a seamless relief printing form plate material from a photosensitive resin solid-state form plate, grinding and polishing for uniforming a form plate thickness and smoothing surface are generally performed similarly to the case of the above rubber after winding a photosensitive resin solid-stage form plate on the surface of a cylinder as shown in the above Patent Documents 5 and 6, pressurizing, heating, and fusion-bonding the matching joint of an edge by a calendar roller or the like and thereafter a grinding or polishing step for uniforming a form plate thickness and smoothing surface are performed similarly to the case of the above rubber. Moreover, a uniform carbon black layer having no pin hole on the surface as shown in the above Patent Document 1 is formed as a substitute for a negative film, selectively ablation-removed by a digital-controlled laser-drawing apparatus as shown in the above Patent Document 2 to manufacture a mask and a seamless relief printing form plate is obtained by passing through a publicly-known exposure, solvent-phenomenon, drying, and post-exposure steps.

However, as pointed out in the above description, it is difficult to say that seams are completely absent and discontinuity of a printed matter at a seam frequently becomes a problem.

In the above Patent Documents 3 and 4, photosensitive resin is not practically used due to problems of odor and pollution because of diluting the resin by a solvent before it is applied and evaporating it after it is applied to cure a photosensitive resin layer, a problem of reproduction by expansion of an image caused by imperfect adhesion between a negative film and a photosensitive resin layer because of simply pressure-welding the negative film without using vacuum attraction, a problem of involvement of bubbles which is the fate of liquid-state resin, or a problem of liquid-state resin molding that the total accuracy as a seamless printing form plate is not kept in a practical use area.

In the above Patent Document 7, a resin supply mechanism (bucket) is closed and supply of liquid-state photosensitive resin to a cylinder is stopped, the liquid-state resin held by the doctor blade side is transferred to a part of the liquid-state resin layer whose applied thickness is already uniformed at the moment when the doctor blade at the front end of the bucket is separated from the resin applied to the outer periphery of the cylinder and becomes an irregular thickness or a defect of a convex portion and smoothness is lost. Therefore, the accuracy of a printing form plate is out of a printing applying range to cause a printing trouble. Moreover, the following problems are included for practical use: a problem of involving bubbles when the bucket is opened or closed or in the smoothing step by the doctor blade and a deficit portion is formed nearby the resin layer surface and a problem that a resin applied width is fixed because of the bucket structure and it is impossible to easily correspond to a size change of a cylinder width.

In the above Patent Document 8,when applying liquid to a rotating cylindrical object at a uniform thickness, the liquid is easily flown due to gravity or rotational centrifugal force unless the liquid has a viscosity to a certain extent and the shape of the liquid is not easily held. Because the thickness of a resin layer of a relief printing form plate ranges between 0.5 and 7.5 mm (between 1.14 and 2.84 mm for laser carving), the layer cannot be applied at a uniform thickness and there is a hazard that the liquid is separated from the cylindrical object and dripped. The hazard that the liquid is dripped most frequently occurs when the applied liquid reaches the lowest position.

Moreover, When directly using the liquid-state photosensitive resin used in accordance with the planar exposure method of the flexo-printing relief plate making system for laser carving, a lot of foreign matter (including viscous liquid) is produced on a resin cured layer to be laser carved. Therefore, occurrence of the foreign matter is restrained by adding an inorganic porous material. However, it is a current situation that the viscosity of the liquid-state photosensitive resin is extremely increased by adding the inorganic porous material.

Thus, the liquid-state photosensitive resin for relief printing having a high laser carving characteristic is very viscous compared to a general liquid-state photosensitive resin. When applying the high-viscous liquid-state resin by a spray mechanism in a spiral mode, there is a problem that bubbles are generated on the boundary between the resin applied through the previous rotation and the newly applied resin. Moreover, a specific embodiment showing that by what means it possible to spray-apply the high-viscous liquid-state photosensitive resin is not described.

Moreover, at the first-stage smoothing station, extra liquid-state resin is diffused from the both ends of the station contact face to the circumference when the applied liquid-state resin passes through the narrow area of the station. Therefore, it affects the liquid-state resin smoothed by the previous rotation and rather causes the thickness of the applied liquid-state resin to deteriorate than smoothing.

Moreover, a problem of involving bubbles when the front end of the applied liquid-state resin contacts with the above station is included. Therefore, it is possible to estimate that practical use is not realized. Furthermore, about exposure, there is no specific description that a resin layer optically-cured by a high-intensity ultraviolet light contributes to improvement of printing reasonableness as relief printing. Thus, liquid-state photosensitive resin to be used is different depending on purposes of a laser-carving seamless printing original form plate and an offset printing blanket, it is clear that manufacturing method and apparatus are different.

The present invention is made to solve the problems and its object is to provide a method and an apparatus for manufacturing a relief material for seamless printing capable of manufacturing a relief material for seamless printing having a high-accuracy thickness and high printing reasonableness by preferable surface smoothing characteristic and completely free from seams, improving the operability by making conventional negative-film manufacturing step and solution developer step unnecessary, and realizing resource saving and environment maintenance.

DISCLOSURE OF THE INVENTION

The method for manufacturing a relief material for seamless printing according to item 1 of the present invention is a method for manufacturing a relief material for seamless printing using a liquid-state photosensitive resin, comprising a setting step of setting a workpiece using either of a printing cylinder and a printing sleeve integrally supported by a metallic mandrel to holding rotating means for holding and rotating the workpiece, a supplying step of supplying a liquid-state photosensitive resin having a viscosity capable of holding an applying shape without being influenced by the gravity and centrifugal force due to rotation to a resin receiving plate which has a predetermined inclination and of which front end has a doctor blade shape by resin supplying means at a desired applied width in a linear mode, a molding step of molding the liquid-state photosensitive resin supplied to the resin receiving plate into a predetermined applied thickness by a front-end cutting edge of the resin receiving plate while rotating the workpiece and applying the resin to the outer periphery of the workpiece at a desired applied width, and an exposing step of forming a photosensitive resin cured layer by applying high-intensity ultraviolet light to the liquid-state photosensitive resin applied to the outer periphery of the workpiece while rotating the workpiece and thereby optically curing the liquid-state photosensitive resin so that it can be carved by an infrared laser beam.

Thereby, liquid-state photosensitive resin having a viscosity capable of holding an applying shape without being influenced by the gravity and centrifugal force due to rotation is supplied to the resin receiving plate by resin supplying means at a desired applied width in the linear mode and an applied thickness is molded by a front-end cutting edges while rotating the workpiece and applying the liquid-state photosensitive resin to the outer periphery of the workpiece by the resin receiving plate. Therefore, it is possible to uniform and smooth the applied thickness. Moreover, it is possible to improve the printing reasonableness of a photosensitive resin cured layer by high-intensity ultraviolet exposure.

Moreover, the method for manufacturing a relief material for seamless printing according to item 2 of the present invention is characterized in that at least one end of the resin receiving plate has a resin flow preventive movable dam linearly movable in the axis center direction of the workpiece in item 1.

Thereby, by properly moving the movable dam, it is possible to set an optional applied width.

Furthermore, the method for manufacturing a relief material for seamless printing according to item 3 of the present invention further comprises a shaping step of shaping the surface of the photosensitive resin cured layer in item 1.

Thereby, because the surface of the photosensitive resin cured layer is shaped, it is possible to easily manufacture a relief material for seamless printing (also referred to as original form plate for seamless printing) having a high-accuracy thickness and a surface smoothness preferable for printing.

Furthermore, the method for manufacturing a relief material for seamless printing according to item 4 of the present invention is characterized in that the viscosity of the liquid-state photosensitive resin supplied in the supplying step ranges between 6 and 50 kPa·s (both included) at 20° C. and the ultraviolet light in the exposing step has a wavelength area of 200 to 400 nm and an ultraviolet intensity of 10 mW/cm$^2$ or more in item 1.

Thereby, because the viscosity of the liquid-state photosensitive resin is set to a value between 6 and 50 Pa·s (both included) at 20° C., it is possible to hold an applying shape without being influenced by the gravity or centrifugal force due to rotation. Moreover, by using ultraviolet light having a wavelength area of 200 to 400 nm and ultraviolet intensity of 10 mW/cm$^2$ or more for the ultraviolet light for liquid-state photosensitive resin exposure, it is possible to form a photosensitive resin cured layer improving the printing reasonableness and the photosensitive resin cured layer can be carved by an infrared laser beam having a wavelength area of 0.7 to 15 μm. Thus, when improving the printing reasonableness of the photosensitive resin cured layer by applying high-intensity ultraviolet light, the notch resistance is improved two times compared to a low-intensity fluorescent-lamp ultraviolet light source, the layer hardly wanes and the hardness is decreased by approx. 5 at Shore A and the landing of set-solid ink is improved.

Furthermore, the method for manufacturing a relief material for seamless printing according to item 5 of the present invention is characterized in that by linearly moving the resin supplying means in the axis center direction of the workpiece in the supplying step, either of first supply for supplying the liquid-state photosensitive resin housed in a resin vessel to the resin receiving plate in the linear mode and a second supply for supplying liquid-state photosensitive resin to the resin receiving plate from at least one or more resin supplying nozzles of the resin supplying means provided for the desired applied width is performed in item 1 or 4.

Thereby, it is possible to stably supply the liquid-state photosensitive resin to the resin receiving plate.

Furthermore, the method for manufacturing a relief material for seamless printing according to item 6 of the present invention is characterized by applying liquid-state photosensitive resin to the outer periphery of the workpiece at a desired thickness while gradually expanding the gap between the front-end cutting edge of the resin receiving plate and the outer periphery of the workpiece by moving the resin receiving plate vertically to the axis center of the workpiece in the molding step in any one of items 1 to 5.

Thereby, because it is possible to confine the bubbles involved in the lowest portion of an applied resin layer at a resin applying start point, it is possible to prevent deficit due to the bubbles on the surface of the resin layer from occurring.

Furthermore, the method for manufacturing a relief material for seamless printing according to item 7 of the present invention is characterized by performing the treatment in the supplying step a plurality of times in any one of items 1 to 6.

Thereby, it is possible to improve the accuracy of the applied thickness of a liquid-state photosensitive resin and prevent involvement of bubbles.

Furthermore, the method for manufacturing a relief material for seamless printing according to item 8 of the present invention further comprises a first removing step for removing extra photosensitive resin cured layer optically cured by exceeding a desired width in the exposing step to a desired thickness in parallel with or after the shaping step in any one of items 1 to 7.

Thereby, it is possible to mold a desired-width photosensitive resin cured layer on the outer periphery of a workpiece using single liquid-state photosensitive resin at a uniform thickness and a seamless printing original form plate for laser carving.

Furthermore, the method for manufacturing a relief material for seamless printing according to claim 9 of the present invention further comprises a carving step for fusion-removing a photosensitive resin cured layer by rotating the workpiece while linearly-moving laser carving means for carving the photosensitive resin cured layer on the outer periphery of the workpiece in the axis center direction of the workpiece and focusing one or more infrared laser beams applied from the laser carving means on the photosensitive resin cured layer in accordance with the control by a digital image recording signal after either of the shaping step and the first removing step in any one of items 1 to 8.

Thereby, by fusion-removing the photosensitive resin cured layer by the infrared laser beam applied from the laser carving means in accordance with the control by the digital image recording signal, it is possible to form a relief image on the surface of the photosensitive resin cured layer and therefore, easily form a relief image.

Furthermore, the method for manufacturing a relief material for seamless printing according to item 10 of the present invention further comprises a second removing step for removing a photosensitive resin cured layer in an area in which formation of the relief image in the carving step is unnecessary to a desired thickness in parallel with or after the shaping step in item 9.

Furthermore, the method for manufacturing a relief material for seamless printing according to item 11 of the present invention is characterized by laser-carving only a relief image forming area by performing interlaced scanning for moving the laser carving means at a high speed in the image unnecessary area in the carving step when the photosensitive resin cured layer in the area in which formation of the relief image is unnecessary is removed to a desired thickness in the second removing step in item 10.

Thereby, in the laser carving unnecessary area, the interlaced scanning in which the moving speed of the laser carving means is higher than the speed in a laser carving forming area is performed in the laser carving unnecessary area and only the laser carving forming area is laser-carved. Therefore, it is possible to greatly decrease the step time.

Furthermore, the method for manufacturing a relief material for seamless printing according to item 12 of the present invention further comprises a cleaning step for cleaning the photosensitive resin cured layer by cleaning means for spraying cleaning fluid having a pressure between 0.2 and 30 MPa (both included) and a temperature between 40 and 140° C. (both included) after any one of the carving step, removing step, and shaping step in any one of items 7 to 9.

Thereby, by spraying the cleaning fluid having the pressure between 0.2 and 30 MPa (both included) and the cleaning fluid having the temperature between 40 and 140° C. (both included) to the photosensitive resin cured layer, it is possible to remove powder-state or liquid-state foreign matter produced on the photosensitive resin cured layer in the carving step. Particularly, this is effective because it is possible to raise the liquid-state viscous foreign matter from the surface of the resin cured layer by hot water or steam. When the pressure of the hot water or steam is 0.2 MPa or higher, it is sufficiently possible to remove the liquid-state foreign matter. When the pressure of the hot water or steam is 30 MPa or lower, it is possible to remove the foreign matter without destroying a minute pattern. Moreover, when the temperature of the cleaning fluid is 40° C. or higher, it is possible to sufficiently raise the viscous liquid-state foreign matter from the surface of the photosensitive resin cured layer and decrease the number of tacks on a form plate. When the temperature of the cleaning fluid is 140° C. or lower, it is possible to restrain a thermal damage to the photosensitive resin cured layer.

Furthermore, the method for manufacturing a relief material for seamless printing according to claim 13 of the present invention further comprises a post-exposing step for applying ultraviolet light to a relief image layer on the outer periphery of the workpiece while rotating the workpiece after either of the carving step and cleaning step in any one of items 9 to 12.

Thereby, it is possible to improve the physical property of the relief image layer of the workpiece as a relief printing form plate and remove surface stickiness.

Furthermore, the method for manufacturing a relief material for seamless printing according to item 14 of the present invention further comprises a surface modifying step for applying a surface modifying agent for modifying the surface of a relief image layer of the workpiece while rotating the workpiece to the relief image layer and drying the agent in item 13.

Thereby when sufficient physical-property improvement or surface stickiness removal effect of the relief mage layer of the workpiece in the post-exposing step as a relief printing form plate cannot be obtained, it is possible to perform the physical property improvement and surface stickiness removal.

Furthermore, the method for manufacturing a relief material for seamless printing according to claim 15 of the present invention is characterized by performing forcible heating and drying while applying the surface modifying agent to the relief image layer in the surface modifying step in item 12.

Thereby, it is possible to decrease the time of the surface modifying step.

Furthermore, the apparatus for manufacturing a relief material for seamless printing according to item 16 of the present invention is an apparatus for manufacturing a relief material for seamless printing using a liquid-state photosensitive resin, which is characterized by including a workpiece continuous rotating mechanism having a structure capable of rotating by integrally connecting a workpiece to whose outer periphery the liquid-state photosensitive resin is applied, a resin supplying mechanism according to any one of a first resin supplying mechanism having a resin supplying nozzle integrated with a vessel for housing the liquid-state photosensitive resin and capable of linearly moving in the axis center direction of the workpiece, and a second resin supplying mechanism having at least one or more resin supplying nozzles in accordance with a desired applied width on a resin supplying header pipe-connected with the vessel for housing the liquid-state photosensitive resin, a resin applying smoothing mechanism having a resin receiving plate whose front end has a doctor blade shape at a position facing the workpiece, having a structure which can linearly move in the direction vertical to the axis center of the workpiece and adjust a tilt angle, and an exposing mechanism capable of applying high-intensity ultraviolet light to liquid-state photosensitive resin applied to the outer periphery of the workpiece and smoothed and linearly moving the applying means in the direction vertical to the axis center of the workpiece.

Thereby, by supplying the liquid-state photosensitive resin to the resin receiving plate at a desired applied width in the linear mode and molding an applied thickness while rotating the workpiece and applying the liquid-state photosensitive resin to the outer periphery of the workpiece, it is possible to uniform and smooth the applied thickness. Moreover, it is possible to improve the printing reasonableness of a photosensitive resin cured layer by high-intensity ultraviolet exposure and it is possible to easily manufacture a relief material for seamless printing having high-accuracy thickness and surface smoothness preferable for printing.

Furthermore, the apparatus for manufacturing a relief material for seamless printing according to item 17 of the present invention is characterized in that the resin receiving plate has a resin flow preventive movable dam capable of linearly moving in the axis center direction of the workpiece at at least one end in item 16.

Thereby, it is possible to easily change an applied width in accordance with a request.

Furthermore, the apparatus for manufacturing a relief material for seamless printing according to item 18 of the present invention further comprises a working-tool holding pedestal mechanism capable of linearly moving a working-tool holding pedestal in the axis center direction of the workpiece and further includes at least one of a culling mechanism, grinding mechanism, and polishing mechanism capable of linearly moving the working tool fixed by the holding pedestal in the direction vertical to the axis center of the workpiece in item 16 or 17.

Thereby, because it is possible to further shape the surface of a photosensitive resin cured layer, it is possible to obtain more-accurate surface thickness and surface smoothness.

Furthermore, the apparatus for manufacturing a relief material for seamless printing according to item 19 of the present invention is characterized by setting a moving-position detecting mechanism capable of detecting a moving position at the time of the linear movement to at least one of the resin supplying mechanism, resin applying smoothing mechanism, exposing mechanism, working-tool holding pedestal mechanism, cutting mechanism, grinding mechanism, and polishing mechanism in item 16 or 18.

Thereby, it is possible to detect a moving position at the time of the linear movement and accurately perform alignment of each moving object.

Furthermore, the apparatus for manufacturing a relief material for seamless printing according to item 20 of the present invention further comprises a rotation control mechanism for controlling a rotational position and circumferential speed of the workpiece by detecting the rotation angle of the workpiece in any one of items 16 to 19.

Thereby, because it is possible to accurately control the rotational position and rotation angle of the workpiece, it is possible to properly perform the treatment for manufacturing a relief material for seamless printing.

Furthermore, the apparatus for manufacturing a relief material for seamless printing according to 21 of the present invention is characterized in that the first resin supplying mechanism is a resin supplying mechanism according to either of a dispenser system and a syringe system respectively having a constant quantity supplying characteristic for unit time and a vessel for housing the liquid-state photosensitive resin is either of a bellows-type cartridge vessel and a back-lid push-to-connect-type cartridge vessel in any one of items 16 to 20.

Thereby, it is possible to supply the liquid-state photosensitive resin to the workpiece by a proper quantity.

Furthermore, the apparatus for manufacturing a relief material for seamless printing according to item 22 of the present invention is characterized in that the second resin supplying mechanism is a resin supplying nozzle having at least one or more resin supplying cutting-off control mechanisms connected with either of a housing vessel having resin moving means for moving liquid-state photosensitive resin and a storing apparatus and the resin supplying means is a constant-quantity pressure pump having a constant-quantity supplying characteristic for unit time and a mechanism for removing bubbles in the liquid-state photosensitive resin is set between either of the housing vessel and the storing apparatus and the resin supplying nozzle in any one of items 16 to 21.

Thereby, it is possible to supply the liquid-state photosensitive resin to the workpiece by a proper quantity and prevent bubbles from mixing in the liquid-state photosensitive resin.

Furthermore, the apparatus for manufacturing a relief material for seamless printing according to item 23 of the present invention further comprises a signal converting mechanism for receiving and storing a digital image recording signal and converting the stored signal into a light-modulation control signal of an infrared laser beam, a laser generating mechanism for generating one or more infrared laser beams, a control mechanism for independently setting the infrared intensity and applying time every infrared laser beam, and a laser carving head mechanism having optical system means fixed by the holding pedestal to focus the infrared laser beam on the surface of a photosensitive resin cured layer obtained by curing liquid-state photosensitive resin on the outer periphery of the workpiece in any one of items 16 to 22.

Thereby, by fusion-removing the photosensitive resin cured layer by the infrared laser beam applied from the laser carving means in accordance with the control by a digital image recording signal, it is possible to form a relief image on the surface of the photosensitive resin cured layer. Therefore, it is possible to easily form a relief image.

Furthermore, the apparatus for manufacturing a relief material for seamless printing according to item 24 of the present invention further comprises either of a water-jet cleaning unit and a hot-water high-pressure cleaning unit for cleaning a relief image laser-carved on the photosensitive resin cured layer by the infrared laser beam in any one of items 16 to 23.

Thereby, it is possible to remove power-state or liquid-state foreign matter generated on the photosensitive resin cured layer through laser carving.

Furthermore, the apparatus for manufacturing a relief material for seamless printing according to item 25 of the present invention further comprises a surface modifying mechanism for spraying or applying a surface modifying agent for modifying the surface of a laser-carved relief image to the relief image in item 23 or 24.

Thereby, it is possible to obtain sufficient physical-property improvement and surface viscosity removing effect as a relief printing form plate of a relief image.

Furthermore, the apparatus for manufacturing a relief material for seamless printing according to item 26 of the present invention further comprises a heating mechanism for forcibly heating and drying the surface modifying agent applied to the relief image by the surface modifying mechanism in item 25.

Thereby, it is possible to reduce the time of the surface modifying step.

BEST MODE FOR CARRYING OUT THE INVENTION

Then, embodiments of the present invention are described below by referring to the accompanying drawings. In drawings referenced in the following description, a portion same as other drawing is shown by the same symbol.

However, an embodiment of an apparatus for manufacturing a relief material for seamless printing of the present invention is described while referring to a manufacturing apparatus to be easily realized by a method for manufacturing a relief material for seamless printing of the present invention in accordance with the accompanying drawings.

However, though the present invention is understood by FIGS. 1 to 14, embodiments of the present invention are not restricted to the drawings.

Figure 1:
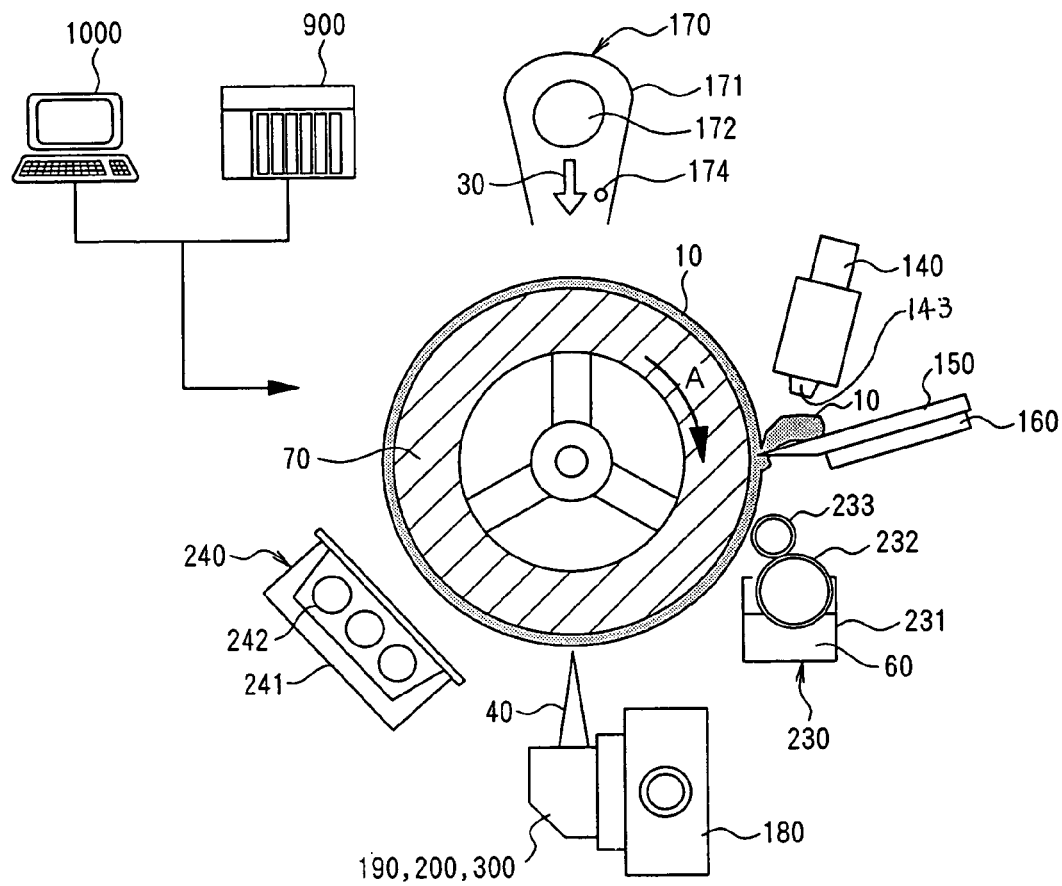
FIG. 1 is a side view for explaining a schematic configuration of an apparatus for manufacturing a relief material for seamless printing of an embodiment of the present invention.
Figure 2:
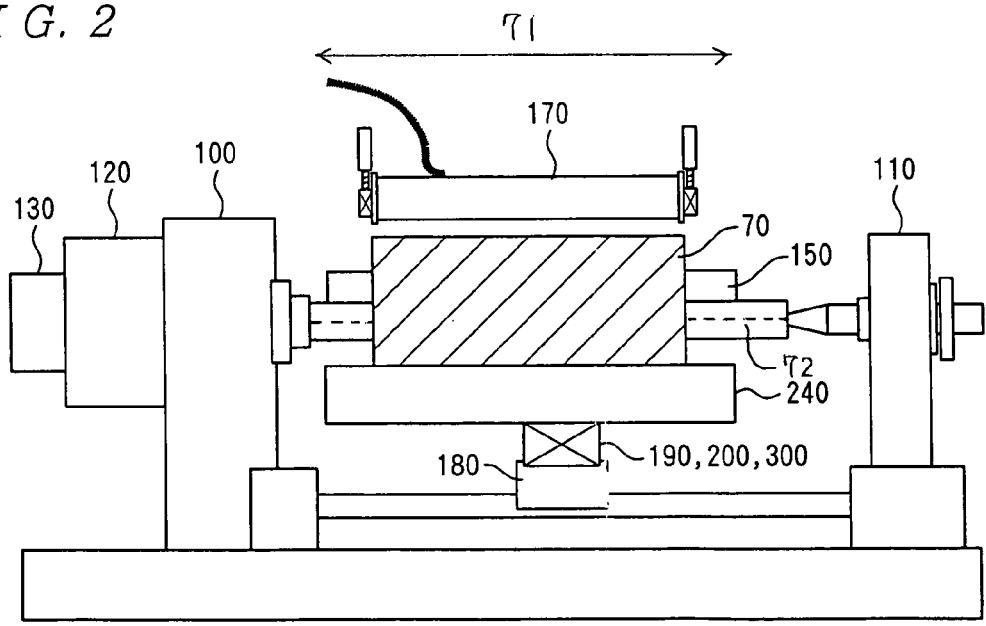
FIG. 2 is a front view for explaining a schematic configuration of an apparatus for manufacturing a relief material for seamless printing of an embodiment of the present invention.

FIGS. 1 and 2 are illustrations of an apparatus of an embodiment for manufacturing a relief material for seamless printing by applying liquid-state photosensitive resin to the outer periphery of a workpiece using either of printing sleeves integrally supported by a printing cylinder and a mandrel (metallic mandrel) at a uniform thickness so that a defect such as bubble does not occur, optically curing resin by high-intensity ultraviolet exposure and improving the printing reasonableness of a resin cured layer, grinding or polishing the resin, then laser-carving a resin cured layer and forming a relief image, and post-treating the image. FIG. 1 is a side view and FIG. 2 is a front view.

Figure 3:
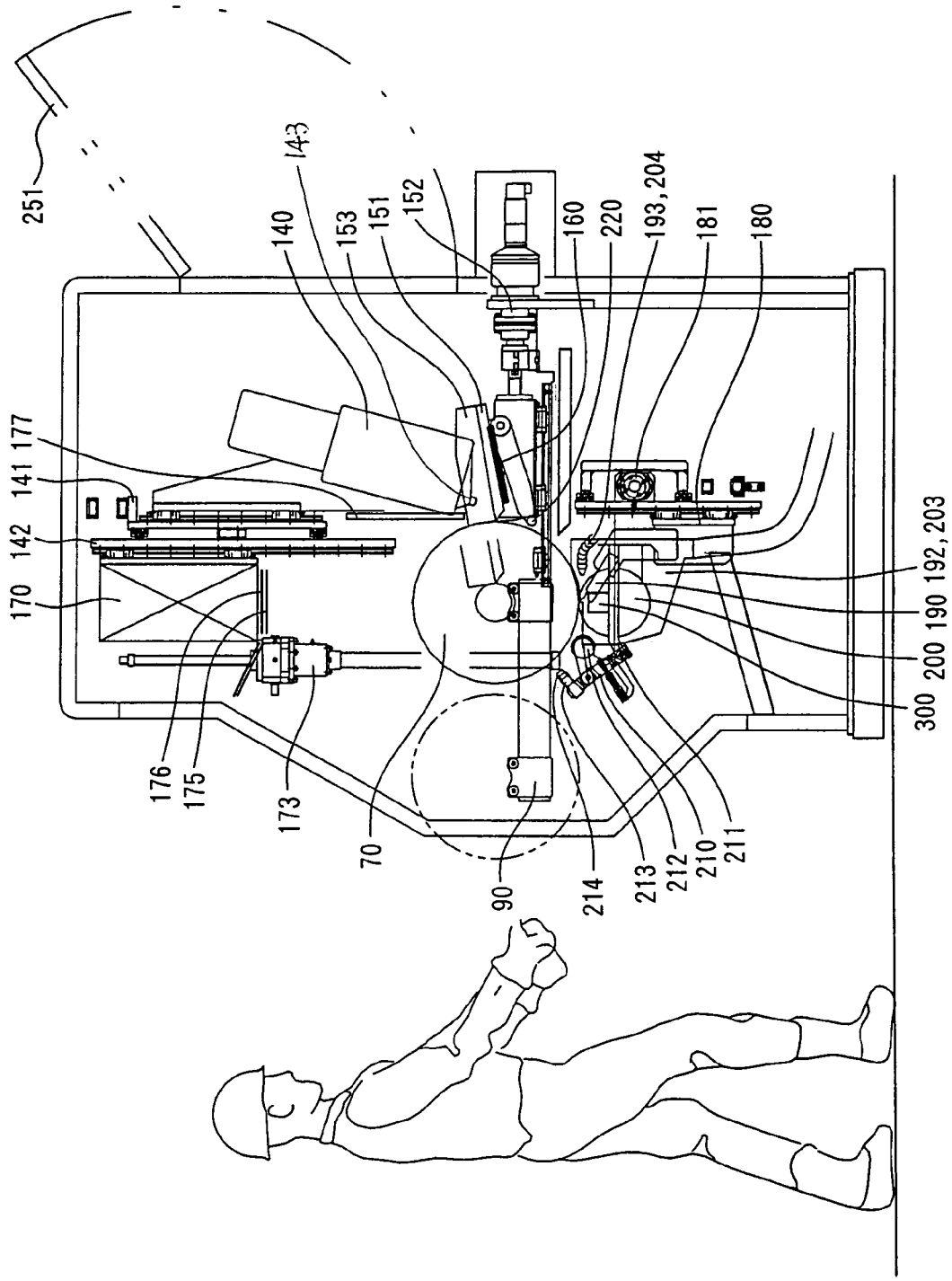
FIG. 3 is a side view showing a schematic configuration of an apparatus for manufacturing a relief material for seamless printing of an embodiment of the present invention.
Figure 4:
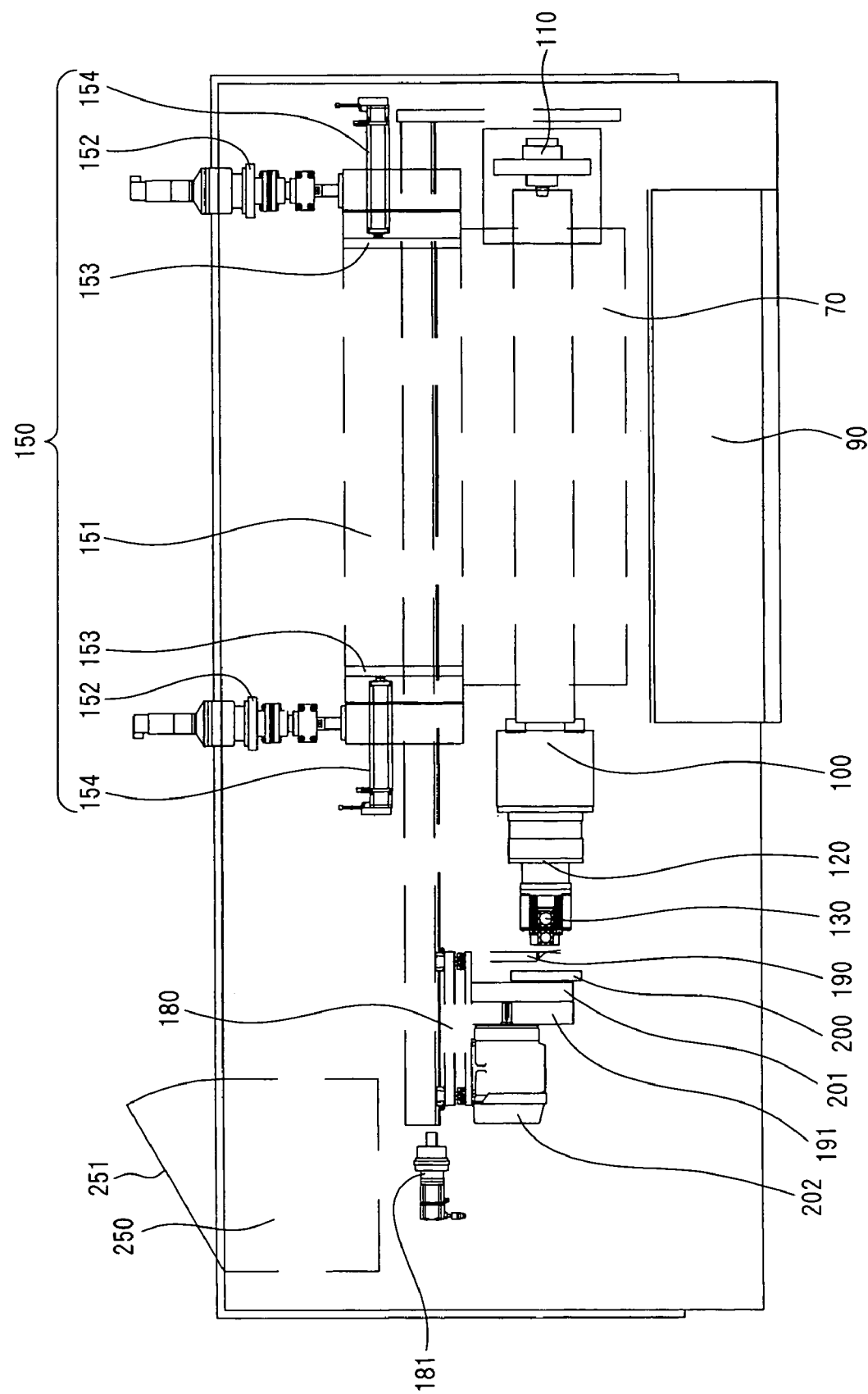
FIG. 4 is a top view showing a schematic configuration of an apparatus for manufacturing a relief material for seamless printing of an embodiment of the present invention.
Figure 5:
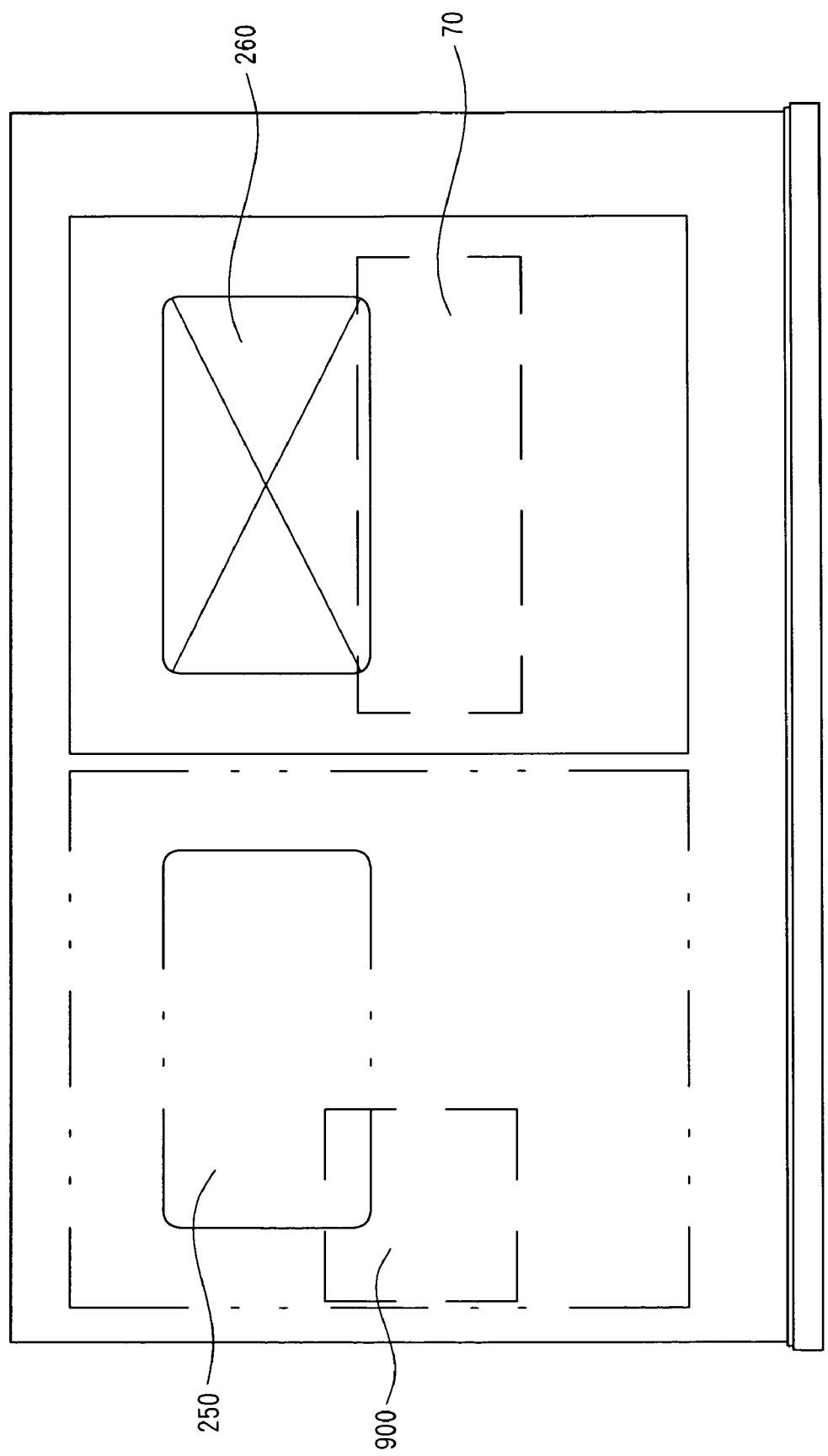
FIG. 5 is a front view showing a schematic configuration of an apparatus for manufacturing a relief material for seamless printing of an embodiment of the present invention.

FIGS. 3 to 5 show a schematic configuration of this manufacturing apparatus. FIG. 3 is a side view, FIG. 4 is a top view, and FIG. 5 is a front view.

Figure 6:
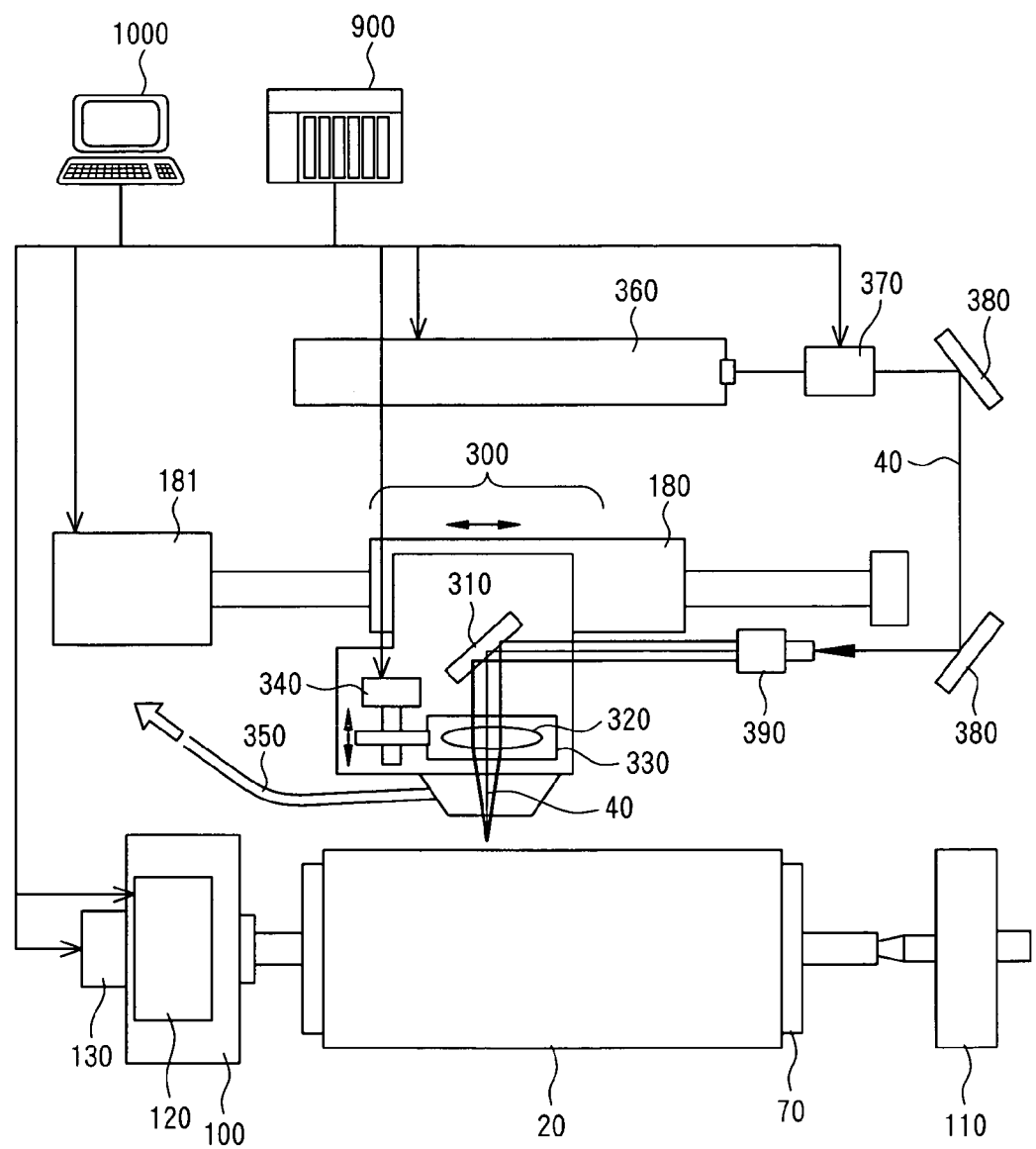
FIG. 6 is an illustration showing a schematic configuration of a laser carving mechanism of an apparatus for manufacturing a relief material for seamless printing of an embodiment of the present invention.

FIG. 6 is an illustration showing a schematic configuration obtained by picking up only a mechanism relating to a laser carving step. In the case of this embodiment, a laser carving mechanism is mounted on this manufacturing apparatus. However, it is also possible to use a laser-carving dedicated machine (for example, ZED-Mini series) already put on sale.

Figure 7:
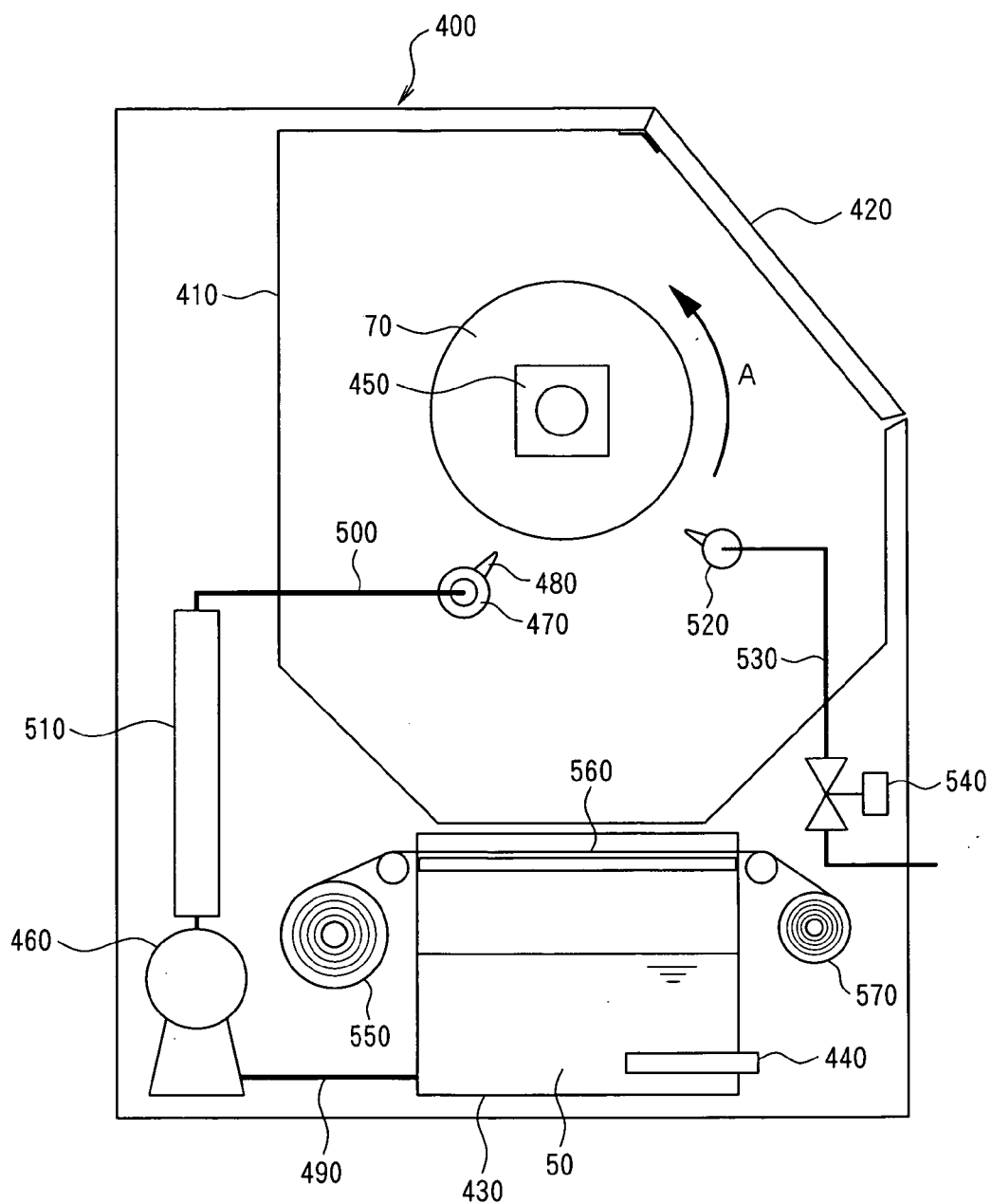
FIG. 7 is an illustration showing a schematic configuration of a hot-water high-pressure or a steam cleaning unit of an apparatus for manufacturing a relief material for seamless printing of an embodiment of the present invention.

FIG. 7 is an illustration explaining a schematic configuration of a hot-water high-pressure cleaning unit used of this embodiment. It is also possible to substitute the cleaning unit with a dedicated machine (for example, hot-water high-pressure cleaning unit made by Karcher).

Figure 8:
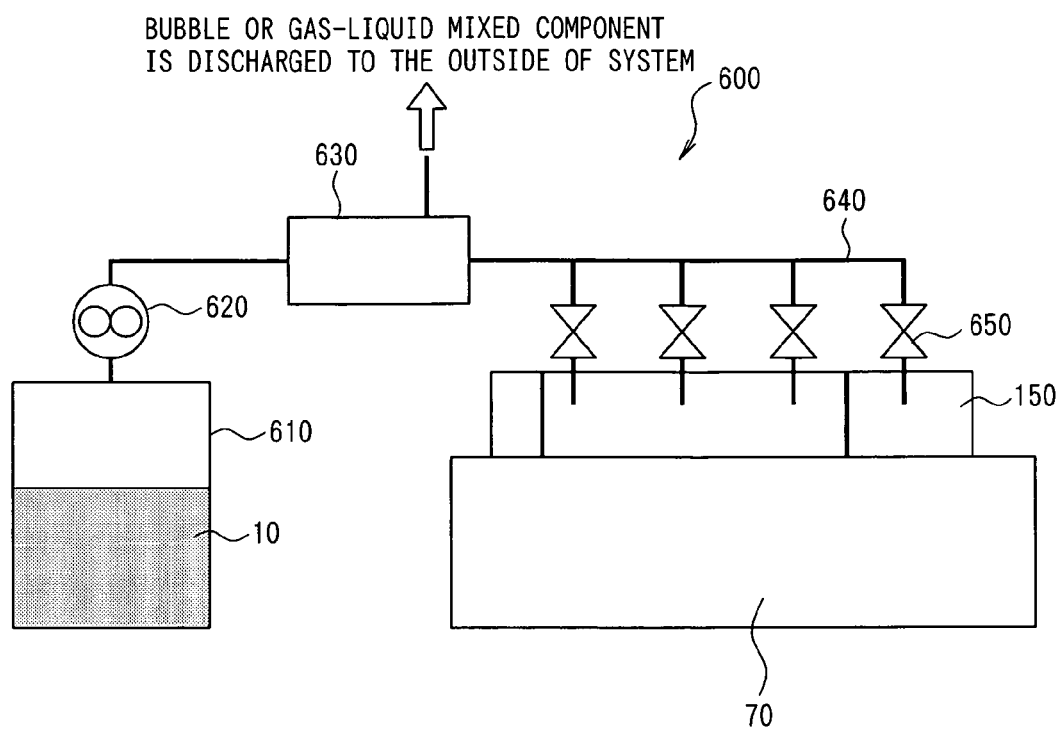
FIG. 8 is an illustration of a constant-position-nozzle-type liquid-state photosensitive-resin supplying unit of an apparatus for manufacturing a relief material for seamless printing of an embodiment of the present invention.

FIG. 8 is an example in which a liquid-state photosensitive resin supply nozzle is the constant-position type, which is an illustration showing a schematic configuration of a resin supplying unit having a configuration different from the movable-nozzle-type resin supplying unit shown in FIGS. 1 and 3.

Figure 9:
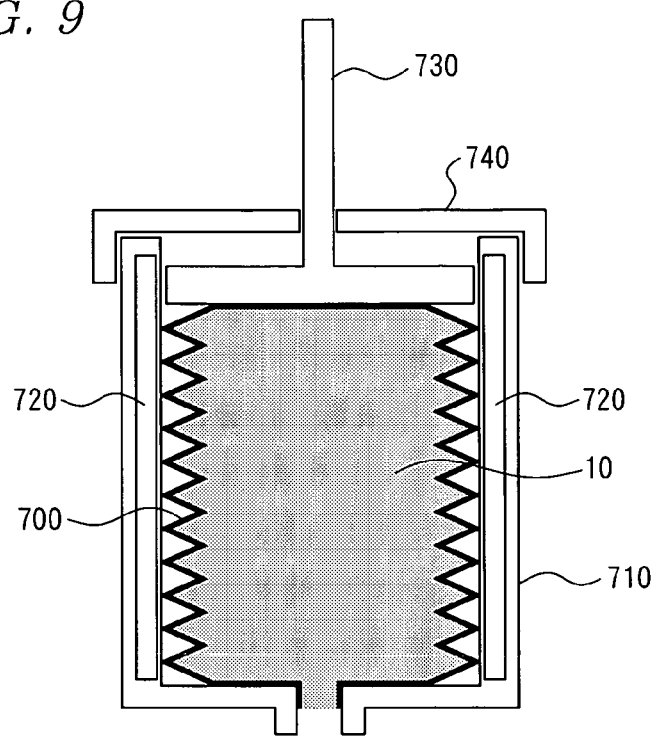
FIG. 9 is an illustration of a bellows-type cartridge vessel of an apparatus for manufacturing a relief material for seamless printing of an embodiment of the present invention.
Figure 10:
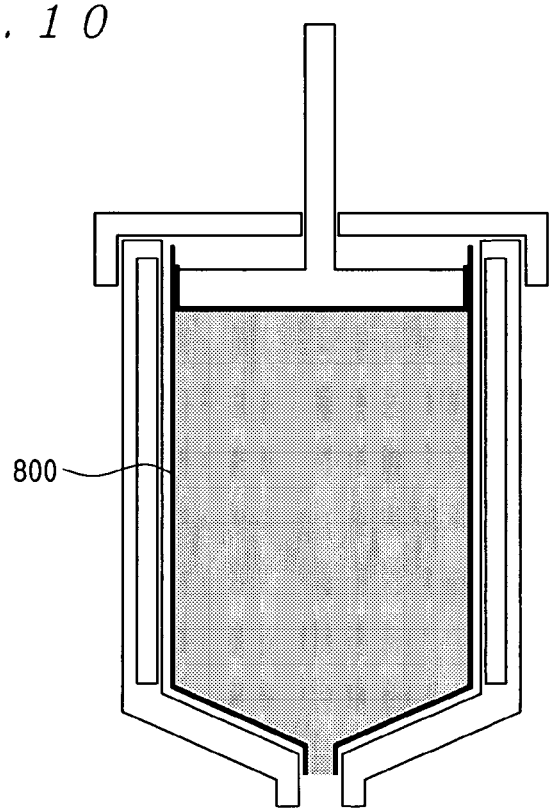
FIG. 10 is an illustration of a back-lid push-to-contact-type cartridge vessel of an apparatus for manufacturing a relief material for seamless printing of an embodiment of the present invention.

FIGS. 9 and 10 are illustrations of two different types of cartridge vessels in the dispenser-type resin supplying unit shown in FIGS. 1 and 3.

Figure 11:
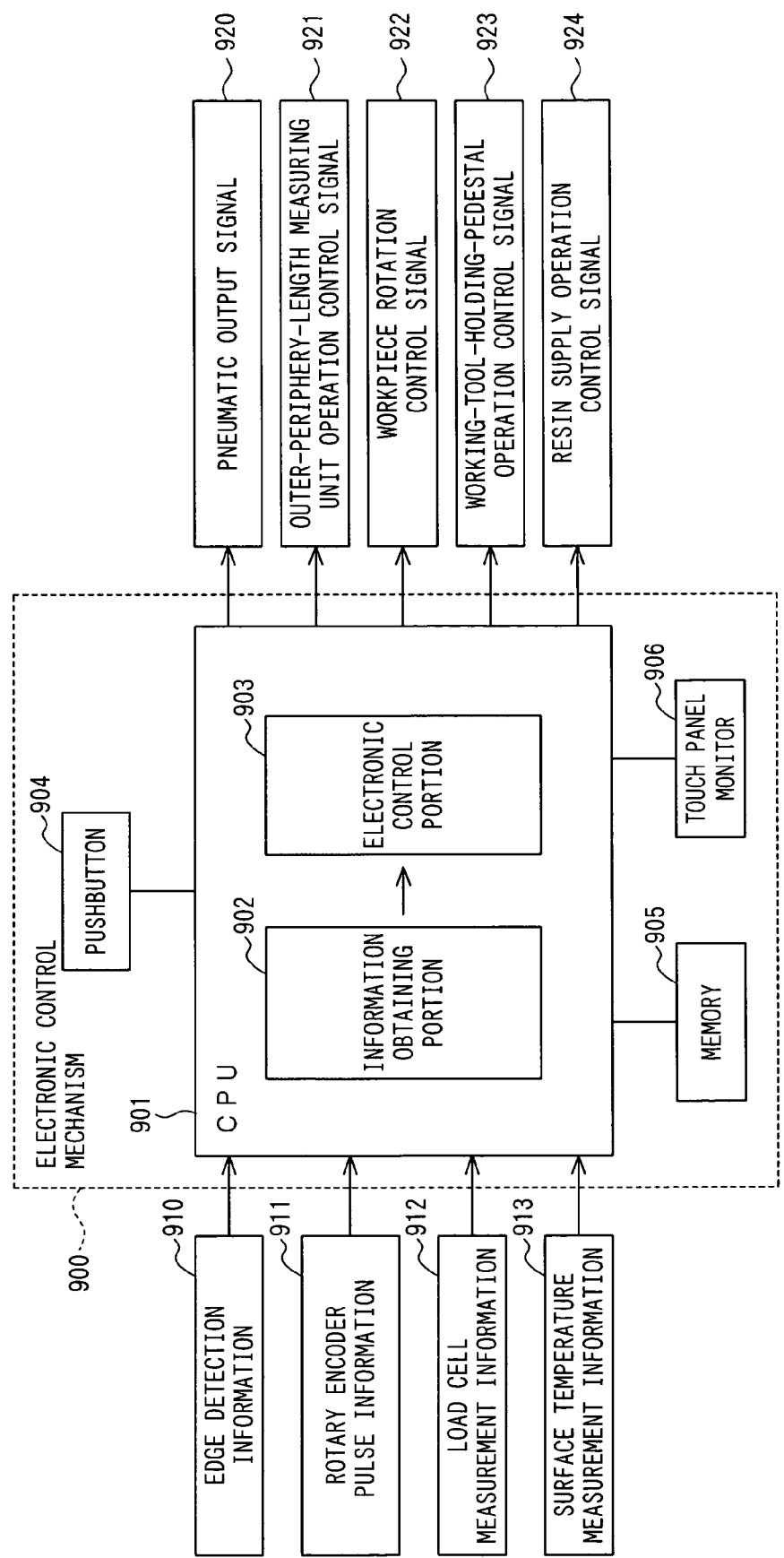
FIG. 11 is a block diagram showing a configuration of an electronic control mechanism of an apparatus for manufacturing a relief material for seamless printing of an embodiment of the present invention.

FIG. 11 is a computer block diagram showing a schematic configuration of an electronic control mechanism of this manufacturing apparatus.

Figure 12:
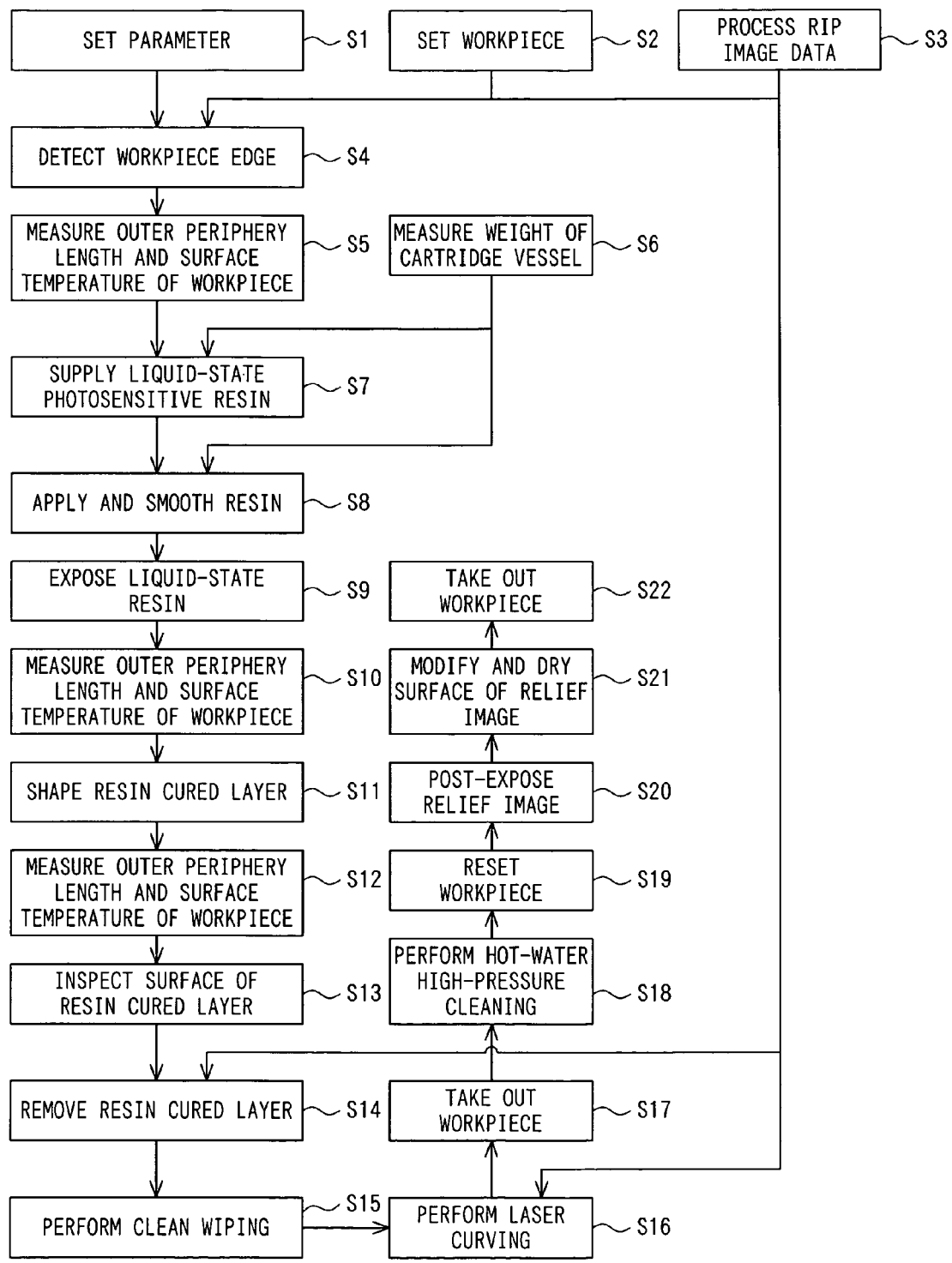
FIG. 12 is a flowchart for explaining the main operation of a method for manufacturing a relief material for seamless printing of an embodiment of the present invention.

FIG. 12 is a flowchart for explaining operations of this manufacturing apparatus.

Figure 13:
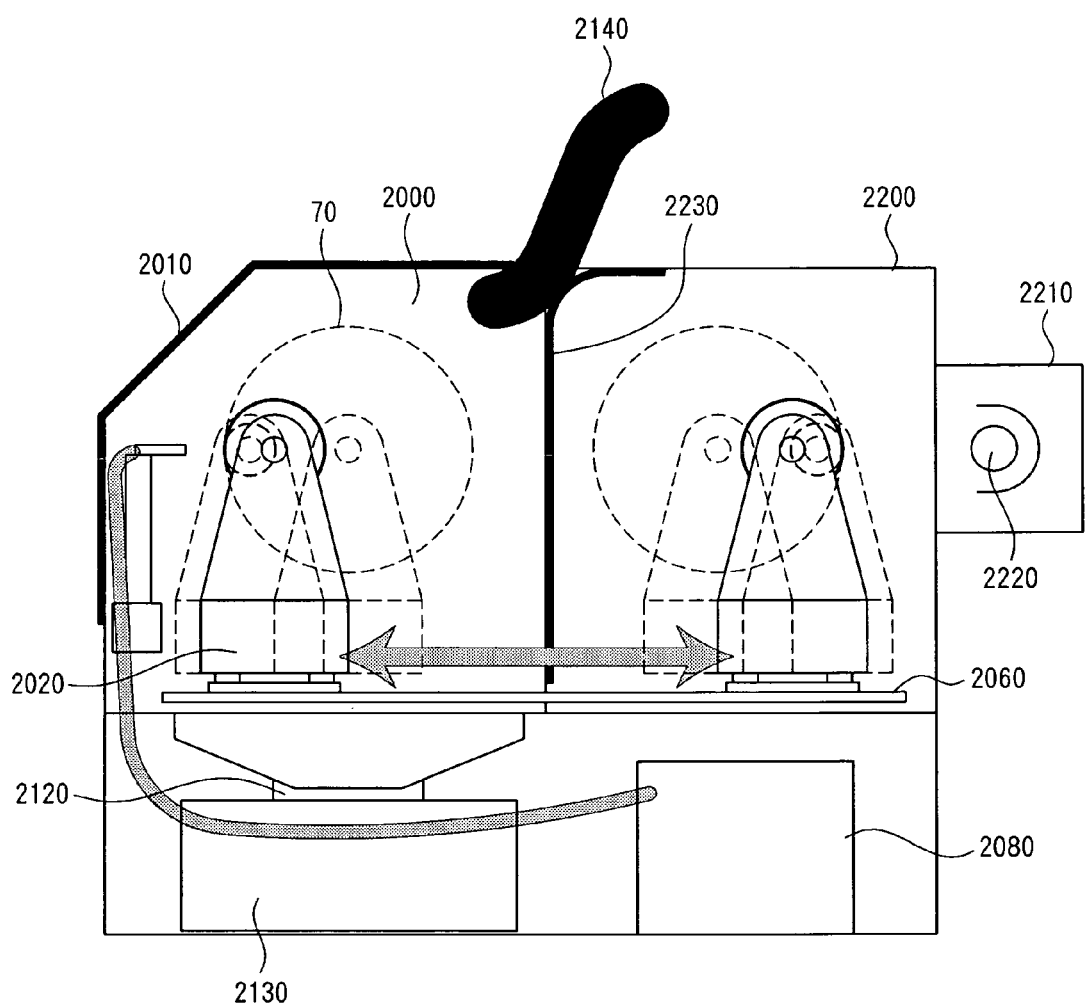
FIG. 13 is a side view showing a schematic configuration of a post-treating device in which a hot-water high-pressure (or steam) cleaning unit and a post-exposing unit of an apparatus for manufacturing a relief material for seamless printing of an embodiment of the present invention are integrated.
Figure 14:
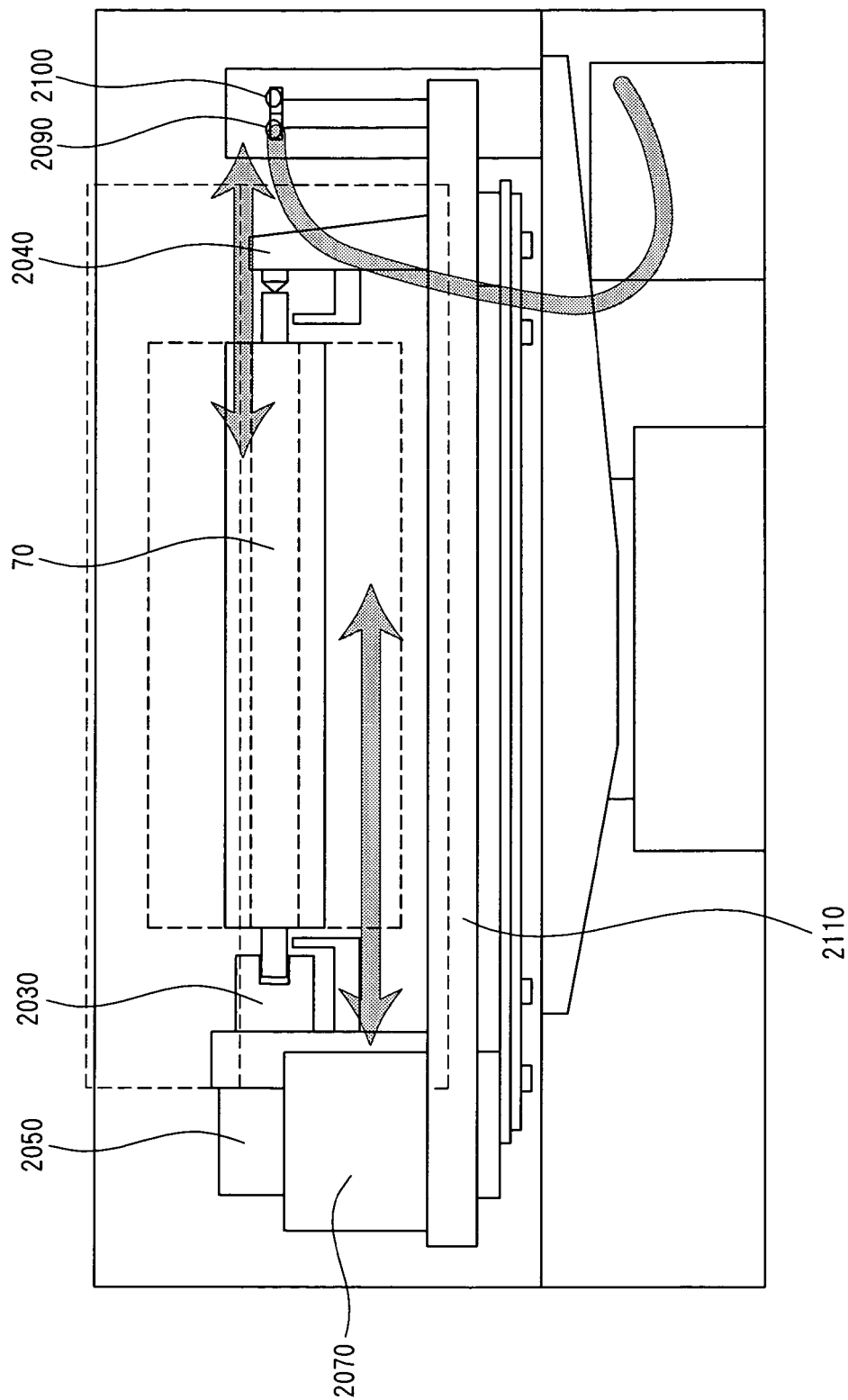
FIG. 14 is a front view showing a schematic configuration of a post-treating device in which a hot-water high-pressure (or steam) cleaning unit and a post-exposing unit of an apparatus for manufacturing a relief material for seamless printing of an embodiment of the present invention are integrated.

FIGS. 13 and 14 show examples of a post-treating device in which a hot-water high-pressure cleaning unit having a shaping mechanism and a post-exposing unit are integrated, which are illustrations showing a schematic configuration of the post-treating device having a configuration different from that in FIG. 7. FIG. 13 is a side view and FIG. 14 is a front view.

This manufacturing apparatus includes a workpiece setting pedestal 90 for easily setting the workpiece 70 to rotating connecting mechanisms 100, 110, and 120 and the workpiece setting pedestal 90 has a slidable structure. Therefore, it is possible to manually insert the pedestal 90 into the setting position of the workpiece 70. FIGS. 1 to 6 show a state in which the workpiece 70 is already connected with a spindle stock 100 serving as a rotating connecting mechanism similarly to a lathe by a tail stock 110 and is integrated with a rotation-driving and rotation-control mechanism 120 having an encoder 130.

As the means for supplying the liquid-state photosensitive resin 10, a liquid-state photosensitive resin supplying unit 140 has a resin supplying nozzle 143 integrated with a cartridge vessel for containing the liquid-state photosensitive resin 10 and supplying the liquid-state photosensitive resin 10 to a resin receiving plate 151 in a linear mode while the resin supplying nozzle 143 linearly moves to the axis center direction 71 of the workpiece 70. FIG. 2 shows the axis center direction 71 and an axis center 72 of the workpiece 70 represented by a broken line. The liquid-state photosensitive-resin supplying unit 140 is described below as an example.

However, as shown in FIG. 8, it is also possible to substitute the resin supplying nozzle with a unmovable liquid-state photosensitive resin supplying unit 600 by using a liquid-state photosensitive resin housing tank 610, a constant-quantity pressure pump 620 for moving a constant quantity of the liquid-state photosensitive resin 10, a defoaming mechanism 630 for defoaming bubbles contained in the liquid-state photosensitive resin 10, a resin supplying header 640, and a switching electromagnetic valve 650 for controlling supply and stop of the liquid-state photosensitive resin 10. Moreover, it is preferable that the capacity of the housed liquid-state photosensitive resin 10 can be measured by a level sensor and a temperature control mechanism for stabilizing the temperature(final purpose is stabilization of viscosity)of the liquid-state photosensitive resin 10 in the supply route of the liquid-state photosensitive resin 10 from the tank 610 up to the resin supplying nozzle.

The liquid-state photosensitive resin supplying unit 140 includes a linear-moving and moving-position detecting mechanism 141 capable of moving in the axis center direction of a workpiece by combining a servomotor with a mechanism (ball screw and linear running guide) for converting the rotational motion of the servomotor into linear motion and a vertically moving mechanism 142 for vertically moving the resin supplying unit 140.

Moreover, the dispenser portion of the resin supplying unit 140 includes a cartridge built-in cylinder 710, a temperature control mechanism 720 for stabilizing the viscosity of the liquid-state photosensitive resin 10, an intruding piston 730, a top upper lid 740, and a not-illustrated load cell for measuring the weight of a cartridge vessel (700 or 800). As the cartridge vessel (700 or 800) for housing the liquid-state photosensitive resin 10, two types such as the bellows type 700 and back lid compression type 800 can be set. In the case of the back lid compression type, a paper vessel or metallic vessel in which aluminum foil and polyethylene are lined can be used.

The front end of the resin applying smoothing unit 150 is formed into a doctor blade shape and the unit 150 is preferably constituted by including the resin receiving plate 151 having a tilt-angle adjusting function, a resin-applying-smoothing-unit linear moving and moving position detecting mechanism 152 capable of moving in the direction vertical to the workpiece 70 and detecting a moving position by combining a servo motor with a mechanism (ball screw and linear running guide) for converting the rotational motion of the servomotor into linear motion, a resin flow preventing dam 153 at least whose one end is movable and having a resin flow preventing movable dam linear moving and moving-position detecting mechanism 154 capable of moving in the axis center direction of a workpiece by combining a servomotor with a mechanism (ball screw and linear running guide) and capable of moving in the axis center direction of the workpiece and detecting a moving position, and a temperature control mechanism 160 set to the back of the resin receiving plate 151.

Moreover, the unit 150 includes an air-driven swing mechanism and a resin-scraping blade unit 220 having any one of rubber, fluorine resin, and solvent-resistant blade at its front end in accordance with the viscosity characteristic of the liquid-state photosensitive resin 10 to be used and scrapes the liquid-state photosensitive resin 10 attached to a doctor blade at the front end of the resin receiving plate 151 by bringing the doctor blade and the scraping blade 220 into contact with each other.

As shown in FIG. 3, an exposing unit 170 for generating high-intensity ultraviolet light is constituted by including an exposing-unit linearly moving and moving-position detecting mechanism 173 capable of moving in the direction vertical to the workpiece 70 and detecting a moving position by combining a servomotor with a mechanism (ball screw and linear running guide) for converting the rotational motion of the servomotor into linear motion, a lamp irradiator 171 including a metal halide lamp 172, an ultraviolet integrator or ultraviolet intensity meter 174 on an ultraviolet route, a band-pass filter unit (UV-A transmission type) 175 having a mechanism which can be opened or closed in accordance with a swing system, and a band-pass filter unit (UV-C transmission type) 176.

As a long arc light source for generating high-intensity ultraviolet light and corresponding to the width of the workpiece 70, this embodiment shows the metal halide lamp 172 for emitting light mainly having an ultraviolet wavelength area of 200 to 400 nm. However, it is preferable to select a lamp for emitting light in an efficient wavelength area such as a high-pressure mercury lamp, ultra-high pressure mercury lamp, microwave-type electrode less ultraviolet lamp, and other high-intensity ultraviolet lamps.

The lamp irradiator 171 includes the lamp 172, a mechanical shutter mechanism for shielding light by reversing a mirror support portion, a heat-ray cutting filter for restraining transmission of heat rays, a cold mirror for transmitting only heat rays at the back, and a lamp air-cooling mechanism. Moreover, to further restrain heat rays, it is possible to use a water-cooled lamp cooling system having a blue filter jacket tube.

Furthermore, the lamp irradiator 171 includes an ultraviolet-shielding shutter unit 177 for protecting areas having the liquid-state photosensitive resin 10 such as the resin supplying unit 140 and resin receiving plate 151 from exposure of ultraviolet light 30.

It is preferable that a working-tool holding pedestal 180 includes a working-tool-holding-pedestal linear moving and moving-position detecting mechanism 181 capable of moving in the axis center direction of a workpiece and detecting a moving position by combining a servo motor and a mechanism (ball screw and linear running guide) for converting the rotational motion of the servomotor into linear motion.

Because a cutting unit 190, grinding (or polishing) unit 200, work outer-periphery-length measuring unit 210, and laser carving head 300 are fixed by the holding pedestal 180, the working-tool holding pedestal 180 is constituted so that movements of the cutting unit 190, grinding (or polishing) unit 200, workpiece outer-periphery-length measuring unit 210, and laser carving head 300 in the axis center direction of the workpiece 70 and detection of a moving position is controlled by driving the holding pedestal 180. The working-tool-holding-pedestal linear moving and moving-position detecting mechanism 181 receives a control signal transmitted from an electronic control mechanism 900 and controls movements and moving position detection of the units (190, 200, 210, and 300) and it is set in parallel with the axis center direction of the workpiece 70.

The cutting unit 190, grinding (or polishing) unit 200, and workpiece-outer-periphery-length measuring unit 210 respectively include a cutting-unit linearly moving and moving-position detecting mechanism 191, grinding-unit linearly moving and moving-position detecting mechanism 201, workpiece-outer-periphery-length measuring unit linearly-moving and moving-position detecting mechanism 211 by combining by respectively combining a servomotor and a mechanism (ball screw and linear running guide) for converting rotational motion of the servomotor into linear motion.

Moreover, the above mechanism 201 has a structure in which a grind stone (or lapping mechanism or buff polishing mechanism) can be rotated and a structure of collecting cutting scraps and grinding scraps by including a cutting-unit vacuum attracting mechanism 192 and cutting-unit vacuum attracting mechanism 203. Furthermore, it is preferable that the mechanism 201 includes a cutting-unit cutting lubricant injecting mechanism 193 and grinding (or polishing)-unit polishing liquid injecting mechanism 204 and a mechanism (not illustrated) for cooling working surface and working tool by cold air.

The workpiece-outer-periphery-length measuring unit 210 further includes an encoder-built-in wheel 212 having an elevating function (not illustrated) driven by air to measure the outer periphery of the workpiece 70, edge detecting sensor 213 for detecting the edge of the outer surface of the workpiece 70, and surface temperature sensor 214 for measuring the surface temperature of the workpiece 70.

As shown in FIG. 6, the laser carving head 300 is constituted by including a mirror 310 for reflecting an infrared laser beam 40, lens supporting mechanism 330, lens 320 for focusing the infrared laser beam 40 on a resin cured layer 20, an infrared-laser-beam-focal-point correcting mechanism 340, and vacuum attracting mechanism 350 for connected by a pipe connected with a vacuum pump through a filter in order to discharge debris produced when the resin cured layer 20 is fusion-removed by the infrared laser beam 40.

As generating means of the infrared laser beam 40, there are a $CO_2$ gas laser having a function for adjusting infrared energy quantity, Nd:YAG laser, fiber laser, and semiconductor laser. In this case, however, it is assumed that the Nd:YAG laser is used. The Nd:YAG laser is constituted by including an infrared laser generator 360, acousto-optic for receiving an image control signal transmitted from the electronic control mechanism 900 and optically modulating the infrared laser beam 40, mirror set 380, and beam expander 390.

Moreover, it is preferable that the laser carving head 300 includes a zooming mechanism capable of automatically changing optical magnifications in accordance with a desired resolution and a mechanism for leading a part of the infrared laser beam 40 emitted from the infrared laser generator 360 to an infrared intensity sensor, feeding back a laser output control signal to the infrared laser generator 360 from the electronic control mechanism 900, and constantly controlling an infrared laser output.

As shown in FIG. 1, the surface modifying unit 230 is a mechanism for thin applying the surface modifying agent 60 to the surface of the resin cured layer 20 on which a relief image is formed after a laser carving step or post-exposing step is completed as an example of roller applying system. This embodiment is constituted by including a surface modifying agent housing tank 231, dipping roller 232 for supplying the surface modifying agent 60, an applying roller 233 for applying the surface modifying agent 60 transferred from the dipping roller 232 to the surface of a relief image, and elevating means by pneumatic driving lowers to a lower waiting position when the applying roller 233 contacts with the surface of the relief image at an applying position and applying operation is completed. To forcibly dry the surface modifying agent 60 applied to the surface of the relief image, it is preferable that this embodiment includes a heating unit 240 having a heater housing box 241 for housing a far-infrared heater 242.

As shown in FIG. 7, because a hot-water high-pressure (steam) cleaning unit 400 is an external device of this manufacturing apparatus, it is necessary to once remove the workpiece 70 from this manufacturing apparatus after a laser carving step is completed.

The hot-water high-pressure cleaning unit 400 is constituted by including a workpiece holding and rotating mechanism 450 having a motor which is rotatable by holding the workpiece 70, switching door 420, treating bath 410 for continuously performing injection of hot high-pressure cleaning liquid 50 and thereafter draining, cleaning liquid tank 430 having a heating heater 440 for housing and heating the cleaning liquid 50, plunger pump 460 for pressurizing the cleaning liquid 50, and high-pressure-water heating heater 510 for further heating the pressurized cleaning liquid 50.

Moreover, in the case of the hot-water high-pressure cleaning unit 400, one or more spraying nozzles 480 for spraying the high-pressure cleaning liquid (or steam) 50 on the resin cured layer 20 on which a relief image is formed are arranged at equal intervals on a nozzle header 470 having means for reciprocating along the axis center direction of the workpiece 70 so as to be able to treat the whole surface of the outer periphery width of the workpiece 70.

The input side of the nozzle header 470 is connected with a high-pressure plunger pump 460 through a high-temperature high-pressure dedicated pipe 500 superior in temperature resistance and pressure resistance and high-pressure water heating heater 510 and the cleaning liquid tank 430 is connected to the input side of the plunger pump 460 through a supplying pipe 490.

Moreover, in the treating bath 410, a draining nozzle 520 for blowing away the cleaning liquid 50 remaining on the surface of the resin cured layer 20 by pressure air is connected with a compressor (not illustrated) through an air pressure pipe 530 and electromagnetic valve 540.

It is preferable that the heating heater 440 for heating cleaning liquid up to a predetermined temperature or keeping the temperature constant is set to the cleaning liquid tank 430 and moreover, any one of a nonwoven-fabric filter, paper filter, wire gauze strainer, and filtering mat, or compound filter obtained by combining them is set to the surface layer of the cleaning liquid 50 housed in the cleaning liquid tank 430 in accordance with the filtering characteristic of fused resin refuse produced due to laser carving and mixed in the cleaning liquid 50. In this case, a nonwoven-fabric filter 560 is used as an example. Moreover, a structure of cleaning a predetermined number of workpieces 70 by a non-woven-fabric roller-wound whole cloth supplying mechanism 550 and non-woven-fabric winding mechanism 570 and by arranging a roller group and then winding the non-woven-fabric filter 560 by a predetermined length in accordance with a filtering area is used.

Moreover, this manufacturing apparatus is constituted of a storing portion (with temperature control mechanism) 250 shown in FIGS. 4 and 5 for making a plurality of cartridge vessels housing the liquid-state photosensitive resin 10 wait, vessel-storing-portion switching door 251, electronic control mechanism 900 having a safety cover having a transparent inside view port 260 and a CPU, and a RIP server 1000 shown in FIGS. 1 and 6 by a computer connected to a network for exclusively performing RIP (Raster Image Processor) processing.

As shown in FIG. 11, the electronic control mechanism 900 includes a CPU 901 having an information obtaining portion 902 and electronic control portion 903 and a memory 905, touch panel monitor 906, and push button 904 are set to the CPU 901 and the touch panel 906 and push button 904 constitute an operating panel.

The CPU 901 can obtain information from an external sensor by the information obtaining portion 902 and controls external units through the publicly-known interface function in the electronic control portion 903 in accordance with the obtained information. This configuration is publicly known. Moreover, input and output control signals show only several typical types.

As shown in FIGS. 13 and 14, the present invention can also use a post-treating device serving as an external of this manufacturing apparatus in which a shaping mechanism also usable for this manufacturing apparatus is included and a hot-water high-pressure (steam) cleaning unit 2000 and a post-exposing unit 2200 are integrated. It is necessary to once remove the workpiece 70 from this manufacturing apparatus after the exposing step, shaping step, or laser carving step is completed.

The post-treating device is provided with workpiece setting pedestal 2020 to be easily set to rotating connecting mechanisms 2030, 2040, and 2050 similarly to the case of this manufacturing apparatus and the workpiece setting pedestal 2020 has a structure in which the tail stock 2040 can slide and it is possible to insert the tail stock 2040 up to the setting position of the workpiece 70. FIGS. 13 and 14 show a state in which the workpiece 70 is connected by a head stock 2030 having a rotating connecting mechanism same as the case of a lathe and the tail stock 2040 and integrated with a rotation-driving and rotation-control mechanism 2050.

The workpiece setting pedestal 2020 has a structure capable of carrying the workpiece 70 from the hot-water high-pressure (steam) cleaning unit 2000 up to an optional position of the post-exposing unit 2200 by a workpiece-setting-pedestal carrying mechanism 2060.

Moreover, the hot-water high-pressure (steam) cleaning unit 2000 includes a switching door 2010, hot-water high-pressure (steam) nozzle 2090 for emitting hot water and high pressure (steam) produced by a hot-water high-pressure (steam) generator 2080, and pressure-air draining nozzle 2100 for emitting pressure air. The unit 2000 has a structure in which resin refuse is removed from emitted hot water through a filter 2120 and the hot water is housed in a recover tank 2130, hot-water steam and mist are discharged to the outside of the apparatus through an exhaust duct 2140. Furthermore, the hot-water high-pressure (steam) nozzle 2090 and pressure-air draining nozzle 2100, and shaping mechanism 2070 are connected to a nozzle and a shaping-unit carrying mechanism 2110 so that they are movable in the axis center direction of the workpiece 70.

The shaping mechanism 2070 is a same mechanism as a shaping mechanism (cutting/grinding/polishing) mounted on this manufacturing apparatus. When performing a shaping step by skipping the shaping step of this manufacturing apparatus, cutting refuse, grinding refuse, and polishing refuse are not produced. Therefore, it is possible to prevent foreign matter from entering liquid-state photosensitive resin in the resin supplying step or molding step.

As shown in FIG. 13, the post-exposing unit 2200 for generating high-intensity ultraviolet light is constituted by including a lamp irradiator 2210 including a metal halide lamp and a shielding shutter 2230 which can be opened or closed.

This embodiment shows the metal halide lamp 2220 mainly emitting an ultraviolet wavelength area of 200 to 400 nm as an example. However, it is preferable to select a lamp which emits light in an efficient wavelength area such as a high-pressure mercury lamp, ultra-high-pressure mercury lamp, microwave-type electrode less ultraviolet lamp, or other high-intensity ultraviolet lamp.

The lamp irradiator 2210 includes the lamp 2220, a mechanical shutter mechanism for reversing a mirror support portion and shielding light, and a lamp air-cooling mechanism.

A method for manufacturing a relief material for seamless printing using this manufacturing apparatus having the above configuration is described by referring to a flowchart corresponding to the main manufacturing step shown in FIG. 12.

As shown in FIG. 12, a parameter is set by the electronic control mechanism 900 in step S1 and then, the workpiece 70 is set in step S2, and a preparing step for image data processing by the RIP server 1000 is completed. In this case, when pressing the manufacturing start button (push button 904), manufacturing by this manufacturing apparatus is automatically started.

This automating step includes steps S4 to S12. First, an edge on the outer surface of the workpiece 70 is detected in step S4, the outer periphery length and surface temperature of the workpiece 70 are measured in step S5, and the weight of a cartridge resin vessel set to the liquid-state photosensitive resin supplying unit 140 is measured in step S6. Moreover, the liquid-state photosensitive resign 10 is supplied to the resin receiving plate 151 by the liquid-state photosensitive resin supplying unit 140 in step S7, and the liquid-state photosensitive resin 10 is applied to the outer periphery of the workpiece 70 and smoothed in step S8, the liquid-state photosensitive resin 10 applied to the outer periphery of the workpiece 70 is exposed in step S9, the outer periphery length and surface temperature of the workpiece 70 are a measured in step S10, the photosensitive resin cured layer 20 is shaped in step S11, and outer periphery length and surface temperature of the workpiece 70 are measured in step S12.

Thereafter, surface defects on the resin cured layer in step S13 are manually inspected, the resin cured layer is automatically removed in step S14, the surface of the resin cured layer is cleanly wiped in S15, and laser carving is automatically performed in step S16.

Moreover, the workpiece 70 is taken out in step S17, then hot-water high-pressure cleaning of a relief image is completed in step S18, the workpiece 70 is reset to this manufacturing apparatus in step S19, the relief image is post-exposed in step S20, surface modifying and drying of relief image are automated in step S21, and the workpiece is taken out and manufacturing of this relief material for seamless printing is completed in step S22.

Then, detailed processings in steps S1 to S22 are described.

In the parameter setting step in step S1, informations on an approximate width and outside diameter of the workpiece 70, effective applied width and applied thickness of the liquid-state photosensitive resin 10, control temperature of the liquid-state photosensitive resin 10, exposure value, and post-exposure value are input from the touch panel monitor 906 in the electronic control mechanism 900.

In the workpiece setting step in step S2, a printing sleeve integrated with a mandrel (metallic mandrel) constituting the workpiece 70 is made of FRP (Fiber Reinforced Plastic). This manufacturing apparatus can correspond to a workpiece width of 300 to 1200 mm and outside diameter of 100 to 500 mm.

As shown in FIG. 3, the workpiece 70 is mounted on the workpiece setting pedestal 90 before manufacturing and moved up to a setting position by sliding the workpiece setting pedestal 90.

As shown in FIG. 2, the both ends of a mandrel (not illustrated) constituting the workpiece 70 has a structure in which shafts are protruded and one shaft is held by a three-claw chuck or four-claw chuck of the spindle stock 100 to integrally connect it with the rotation-driving and rotation-control mechanism 120 having a servomotor and the tail stock 110 is moved in accordance with the width size of the workpiece 70 to keep it in a rotation waiting state in which the other shaft is held.

Moreover, a rotary encoder 130 for measuring the rotation angle of the workpiece 70 is set on the rotation axis center to measure a rotation angle in accordance with the rotation of the workpiece 70, which is used for control of the processing start angle and completion angle of the workpiece 70 in steps S5, S10, and S12 for measuring the rotation angle of the workpiece 70 in accordance with the rotation of the workpiece 70 and outer periphery length of the workpiece 70, step S8 for applying and smoothing the liquid-state photosensitive resin 10, step S9 for exposing the liquid-state photosensitive resin 10, step S11 for shaping the photosensitive resin cured layer 20, S14 for removing the photosensitive resin cured layer 20, step S16 for performing laser carving, step S20 for post-exposing a relief image, and step S21 for modifying and drying the surface of the relief image.

It is preferable that surface treatment in which adhesive force is enhanced in the optical curing step of the liquid-state photosensitive resin 10, a flexible cushion tape is pasted, or the surface treatment is applied to the outer periphery of the tape.

Then, an image data processing step by the RIP server 1000 in step S3 is described below.

When digital image data previously rim-edited by a computer is transferred to the RIP server 1000 through a network or the like, bit map processing is performed by the RIP server 1000 to group the bit map data generated through this processing into a laser-carving unnecessary area and necessary area. In this case, the laser carving unnecessary area is an aggregate in which all image dots constituting one line (circumferential direction of workpiece) are laser-carved and the line at least continuously exceeds the total number of predetermined lines (e.g. 100) and the area other than the laser carving necessary area is defined as a laser carving necessary area. When the grouping data and bit map data are transmitted to the electronic control mechanism 900, a manufacturing waiting state is realized.

When turning on the push button 904 for start of manufacturing, detection of a workpiece edge in step S4 which is the first step in the automating step is started. The workpiece-outer-periphery-length measuring unit 210 is moved to an edge detecting position which is a predetermined distance from the outer surface edge of the workpiece 70 at the spindle stock-100 side by the moving mechanism of the working tool holding pedestal 180. Then, the unit 210 is moved in the direction vertical to the axis center of the workpiece 70 by the workpiece-outer-periphery-length-measuring unit linearly moving and moving-position detecting mechanism 211 in accordance with an approximate outside-diameter set value (value input from touch panel monitor 905 and stored in memory 905) and stops at a predetermined detecting position immediately before contact with the outer surface of the workpiece 70.

Thereafter, an accurate position of the outer surface edge of the workpiece 70 is detected while capturing edge detection information 910 supplied from the edge detecting sensor 213 to the electronic control mechanism 900 and performing repetitive operation by the moving mechanism of the working-tool holding pedestal 180. Then, the workpiece 70 is moved to an edge detecting position which is a predetermined distance from the outer surface edge of the workpiece 70 at the tail stock-110 side by the moving mechanism of the working-tool holding pedestal 180 in accordance with an approximate width set value (value input from touch panel monitor 906 and stored in memory 905) of the workpiece 70 to repeat the edge detecting operation and by detecting an accurate position of the other edge, accurate absolute positions in the axis center direction of the workpiece 70 of the both edges and accurate width of the workpiece 70 are calculated.

Thereafter, a step of measuring the outer periphery length and surface temperature of the workpiece 70 in step S5 is started. When the workpiece-outer-periphery-length measuring unit 210 is moved to a measuring position which is a predetermined distance from the edge of the workpiece 70 by the moving mechanism of the working-tool holding pedestal 180 and an air driving output signal 920 is output to the air cylinder of the encoder built-in wheel 212 from the electronic control mechanism 900, the workpiece 70 rotates by one turn while the encoder built-in wheel 212 contacts with the outer surface of the workpiece 70 and measurement is completed. Thereby, an encoder measurement signal is captured by the electronic control mechanism 900 and an accurate outer periphery length of the workpiece 70 is calculated. The encoder built-in wheel 212 returns to the waiting position after measurement.

This measurement operation is performed three times (a position nearby both-end edges of workpiece 70 and central position). After first and second measurements are completed, the workpiece-outer-periphery-length measuring unit 210 is moved to the next measurement position by the working-tool holding pedestal 180 in accordance with an outer-periphery-length-measuring-unit-operation control signal 921 sent from the electronic control mechanism 900.

Moreover, the temperature of the outer surface of the workpiece 70 is measured by the surface temperature sensor 214 simultaneously with measurement of the outer periphery length and surface temperature measurement information (temperature measured value) 913 from the surface temperature sensor 214 is captured to the electronic control mechanism 900 and processing is performed in accordance with the temperature measured value. It is preferable to temperature-correction-control the relative moving distance from the outer surface of the workpiece 70 of the resin receiving plate 151 in the resin applying and smoothing step in step S8 by the processing means.

When all measurements are completed, the working-tool holding pedestal 180 (movement in axis center direction of workpiece 70) and workpiece-outer-periphery-length measuring unit 210 (movement in direction vertical to workpiece 70) respectively return to the waiting position and a series of measurements of outer periphery length and surface temperature of the workpiece 70 in step S5 is completed.

Then, steps of this embodiment progress to a step of measuring the weight of a cartridge vessel (700 or 800) housing the liquid-state photosensitive resin 10 in step S6.

The liquid-state photosensitive resin 10 used for this embodiment is applied so that an applied thickness is as large as 0.5 to 3 mm while rotating the cylindrical workpiece 70. Therefore, the resin 10 is not influenced by gravity or centrifugal force due to rotation and the resin 10 requires a high viscosity in order to keep an applied shape. Therefore, it is preferable to use a liquid-state photosensitive resin having a viscosity between 6 and 50 kPa·s (both included), more preferably between 100 and 20 kPa·s (both included), or further preferably between 200 and 10 kPa·s (both included).

The liquid-state photosensitive resin used for this embodiment has a composition of 67 parts by weight of prepolymer, 33 parts by weight of monomer, 5.14 parts by weight of filler, 2.8 parts by weight of additive, and 1 to 2 parts by weight of photopolymerization start agent and has a viscosity of 340 Pa·s (20° C.).

Prepolymer: Polycarbonate polyurethane terminal methacrylate

Monomer: Benzyl methacrylate, cyclohexyl methacrylate, butoxy diethylene glycol monomethacrylate Filler: Silic-acid inorganic filler (Spherical and porous)

Additive: 2,6-di-t-butyl-4-methylphenol, 2,2-methoxy-2-phenylacetophenyl acetophenone Optical-polymerization start agent: Benzophenone As shown in FIGS. 9 and 10, the liquid-state photosensitive resin 10 housed in any one of the cartridge vessel 700 (bellows-type) or 800 (back-lid push-to-contact type) and kept in a waiting state in which the resin 10 is set in the cartridge built-in cylinder 710 having the temperature control mechanism 720.

The cartridge built-in cylinder 710 has a load cell (not illustrated). The electronic control mechanism 900 calculates the weight of the liquid-state photosensitive resin 10 housed in the cartridge vessel 700 or 800 in accordance with the load cell measuring information (weight measuring data) 912 transmitted from the load cell. The mechanism 900 performs resin weight measuring control in accordance with the calculated result and when resin supply is insufficient in the supply step of the liquid-state photosensitive resin 10 in the next step S7, outputs an alarm for replacing the cartridge vessel 700 or 800 and performs control for suspension in addition to display control.

Moreover, when repeating step S7 in order to replenish the liquid-state photosensitive resin 10 in step S8 for applying and smoothing the liquid-state photosensitive resin 10, it is preferable that the above resin weight measuring control is repeated in real time to perform control same as the above when the quantity of the liquid-state photosensitive resin in the cartridge vessel 700 or 800 decreases from a predetermined quantity.

Then, supply of liquid-state photosensitive of step S7 is started.

A resin-supplying-operation control signal 924 is output to the resin-applying-and-smoothing-unit linearly moving and moving-position detecting mechanism 152, resin-flow-prevention movable-dam linearly moving and moving-position detecting mechanism 154, and liquid-state photosensitive resin elevating mechanism 142 from the electronic control mechanism 900.

Thereby, the resin receiving plate 151 present at the waiting position moves to a predetermined-thickness control start position and the liquid-state-photosensitive-resin supplying unit 140 present at the waiting position lowers to a predetermined supply position and moreover, moves to a predetermined applied width position in accordance with a desired applied width or so that at least the whole relief-image area in the laser carving step 16 is included.

Then, the liquid-state-photosensitive-resin supplying unit 140 is moved to a predetermined resin supply start position by the liquid-state-photosensitive-resin linearly moving and moving-position detecting mechanism 141 and then, intrudes the cartridge vessel 700 or 800 housing the liquid-state photosensitive resin 10 by an intruding piston 730 connected with a motor driving mechanism at a predetermined speed in accordance with a resin applied thickness. Thereby, a predetermined quantity of the liquid-state photosensitive resin 10 is supplied to the resin receiving plate 151 in a linear mode at a desired applied width. In this case, the linear mode is means for making it possible that resin can be supplied to the resin receiving plate as uniform as possible and represents a state in which the resin having a constant width is linearly supplied like a cord. This includes a nonlinear mode by dripping or spraying and a case in which the resin is supplied from a slit having a slight width such as extrusion from a dice. After supplying the resin, the liquid-state-photosensitive-resin supplying unit 140 rises to the waiting position.

It is allowed to properly set the distance between the front end of the resin supplying nozzle 143 of the resin supplying unit 140 and the resin receiving plate 151. However, it is preferable that the distance is minimized (preferably, 50 mm or less, more preferably 20 mm or less) and the front end of the nozzle is set to a position slightly separate from a doctor at the front end of the plate 151 because bubbles are less convoluted. However, the front end of the nozzle is set to a position slightly separate from the doctor at the front end of the plate 151 to prevent the supplied liquid-state photosensitive resin 10 from immediately contacting with the outer periphery of the plate because the liquid-state photosensitive resin 10 supplied to the plate 151 is slowly flown in the direction of the front-end doctor of the plate 151 due to gravity. In this case, it is allowed to properly set the tilt angle of the resin receiving plate in accordance with the relation with the viscosity of a resin used. However, it is preferable to set the tilt angle between 15 and 75°.

Moreover, the moving speed of the resin supplying unit 140 depends on the viscosity of the liquid-state photosensitive resin 10 used and a supplied quantity of the resin 10. However, a moving speed of several millimeters to tens of millimeters is preferable. Furthermore, it is preferable that a supplied quantity of resin is properly adjusted in accordance with an applied thickness.

Then, step S8 for applying and smoothing the liquid-state photosensitive resin 10 is started.

When a workpiece rotation control signal 922 is output to from the electronic control mechanism 900 to the rotation driving and rotation control mechanism 120, the mechanism 120 slowly (0.005 to 0.5 mm/turn of workpiece) backs the resin receiving plate 151 in the direction vertical to the workpiece 70 while rotating the workpiece 70 in the direction of the arrow A in FIG. 1 (though rotation speed depends on the viscosity, thixotropy, and applied thickness of liquid-state photosensitive resin to be used, standard rotation circumferential speed ranges between several millimeters and tens of millimeters/sec), widens the gap between the outer periphery of the workpiece 70 and the resin receiving plate 151, stops the backing motion of the resin receiving plate 151 when reaching a predetermined applied thickness (not desired applied thickness because resin is applied up to thickness slightly larger than desired applied thickness by anticipating a working margin for cutting, grinding, or polishing in the next step 11), and stops the workpiece 70 when it rotates by predetermined times.

Then, the resin receiving plate 151 is separated from the outer periphery of the workpiece 70 at a breath and thickness control when applying and smoothing step is completed is performed. In this control operation, an convex shape of several millimeters is formed on a liquid-state resin layer on the outer periphery of the workpiece 70 is formed (hereafter referred to as local thickness trouble) over a width of tens of millimeters due to the viscosity of the liquid-state resin 10.

It is preferable that the gap between the resin receiving plate 151 and the workpiece 70 before start of rotation of the workpiece 70 is as small as possible (preferably 0.1 mm or less). This is because bubbles convoluted immediately, before the liquid-state resin 10 first contacts with the outer periphery of the workpiece 70 (hereafter referred to as contact start point bubbles) are less, the bubbles are confined at the lowest portion of an applied resin layer and no defect is generated on the surface of a resin cured layer.

Moreover, to restrain bubbles generated when the front end of the liquid-state resin 10 applied to the outer periphery of the workpiece 70 goes round and contacts with the resin receiving plate 151 again (hereafter referred to as seam bubbles), it is preferable to reduce the rotation speed of the workpiece 70 by ½ to ¹⁄₁₀ compared to the standard rotation speed.

Furthermore, because a necessary minimum quantity of the liquid-state photosensitive resin 10 held by the resin receiving plate 151 is effective for seam bubbles, it is preferable to repeat supply of the liquid-state photosensitive resin 10 at least once or more in step S7 in accordance with a predetermined applied thickness. Furthermore, it is preferable that the temperature (viscosity) of the liquid-state photosensitive resin 10 applied by the temperature control mechanism 160 is stabilized in order to improve an applied-thickness accuracy.

Thus, in the case of supplying of the liquid-state photosensitive resin 10 in step S7 and applying and smoothing of the liquid-state photosensitive resin 10 in step S8, in order to prevent bubbles from entering the liquid-state photosensitive resin 10 to be applied, it is important not only to realize constant-quantity supply of the liquid-state photosensitive resin 10 but also to realize the rotation control of the workpiece 70 and accurately calculate the shape and backing speed of the front end of the resin receiving plate 151, shape of front-end nozzle and structure of a supply stop valve (not illustrated) of the cartridge built-in cylinder 710, distance between the front end of the nozzle and the resin receiving plate 151, and moving speed of the liquid-state-photosensitive-resin supplying unit 140.

Then, exposure of liquid-state photosensitive resin of step S9 is started.

Because the workpiece rotation control signal 922 is output to the rotation driving and rotation control mechanism 120 from the electronic control mechanism 900, the workpiece 70 starts rotation at a constant speed (speed same as the standard rotation circumferential speed in the applying and smoothing step S8.) Moreover, when an exposure start control signal (not illustrated) is output to the exposing-unit linearly moving and moving-position detecting mechanism 173, an ultraviolet light shielding shutter unit 177 closes in order to protect the liquid-state-photosensitive-resin supplying unit 140 and resin applying smoothing unit 150 from exposure of ultraviolet light.

The lamp irradiator 171 lowers from the waiting position up to a predetermined exposure position by the moving mechanism 173 in accordance with the outer periphery length of the workpiece 70 and increases an ultraviolet output of the metal halide lamp 172 two to four times from a waiting state to an exposure state, a mechanical shutter moves to an open state, and exposure is started.

It is preferable that an exposure value is controlled by the ultraviolet light integrator 174 or ultraviolet intensity meter 174 and the exposure time. The photosensitive resin cured layer 20 improving the printing reasonableness is formed by applying high-intensity ultraviolet light having a wavelength area of 200 to 400 nm and an ultraviolet intensity of 10 mW/cm$^2$ or more, preferably 50 mW/cm$^2$ or more, or further preferably 100 W/cm$^2$ or more and the photosensitive resin cured layer 20 can be carved by an infrared laser beam having a wavelength area of 0.7 to 15 μm. As described above, when improving the printing reasonableness of the photosensitive resin cured layer 20, the notch resistance is improved approx two times or more compared to a low-intensity fluorescent-lamp-type ultraviolet light source and the layer 20 does not easily wane and the hardness is lowered by approx. 5° by shore A and the landing of set-solid ink is improved.

Moreover, it is preferable to independently control exposure values of UV-A wavelength and UV-C wavelength by performing wavelength selection post-exposure by switching a band-pass filter unit (UV-A transmission type) 175 and band-pass filter unit (UV-C transmission type). When reaching a predetermined exposure value, the metal halide lamp 172 is light-reduced from an exposure state to a waiting state and moves to a state in which the mechanical shutter is closed. When the workpiece 70 stops rotation and the lamp irradiator 171 rises to a waiting position, the ultraviolet light shielding shutter 177 opens.

Then, step S10 for measuring the outer periphery length and surface temperature of the workpiece is started.

Though description of this step is omitted because this step is the same as the above step S5, it is preferable to perform processing in accordance with the measured outer periphery value and the measured surface temperature and control a cutting value and grinding value or polishing value in the next step S11 for shaping the photosensitive resin cured layer 20.

Then, step S11 for shaping the photosensitive resin cured layer 20 is started.

In this step, the rotation of the workpiece 70 is changed to the high-speed side and the workpiece 70 is rotated at a predetermined rotation speed (condition almost same as the case of standard plastic cutting: 600 to 1,300 rpm when the outside diameter of the workpiece is 250 mm), detected in the above step S4 for detecting an edge, and a shaping start control signal (not illustrated) is output to the working-tool-holding-pedestal linearly moving and moving-position detecting mechanism 181 from the electronic control mechanism 900.

Thereby, the cutting unit 190 present at the waiting position moves to a cutting start position present at a predetermined distance from the edge of the workpiece 70 at the spindle stock-100 side to start cutting. This cutting is divided into coarse cutting and finish cutting. Cutting the portion of a local abnormal thickness portion produced in the above step S9 for exposure is coarse cutting and cutting the portion while preferably keeping a surface smoothing accuracy is finish cutting.

The cutting unit 190 is raised up to a first-time predetermined cutting position in the direction vertical to the axis center of the workpiece 70 (coarse cutting value approximately ranges between 0.3 and 1 mm and finish cutting value approximately ranges between 0.05 and 0.2 mm in accordance with the outer periphery length of the workpiece 70) and cutting similarly to the case of lathe cutting is started.

Moreover, it is preferable that the cutting-unit vacuum attracting mechanism 192 and cutting-unit cutting lubricant injecting mechanism 193 operate while the cutting unit 190 moves at a feed rate of 0.5 to 2.5 mm/r in coarse cutting and a feed rate of 0.1 to 0.5 mm in finish cutting in accordance with the outer periphery length of the workpiece 70 in the case of a predetermined feed rate for one turn of the workpiece 70 in the axis center direction of the workpiece 70.

When the cutting unit 190 reaches a cutting completion position, the first-time cutting is completed. And then, by lowering the unit 190 up to a position slightly separated from the resin cured layer 20 and backing the unit 190 to the cutting start position, the first-time cutting operation is completed. By repeating the cutting operation several times for coarse cutting and finish cutting, the resin cured layer 20 is cut up to a predetermined thickness. Moreover, the shape of the front end of the cutting edge of a cutting bite is sharp but the average surface roughness (hereafter referred to as Ra) decreases. For example, in the case of a bite of approx. 0.1 mm, Ra of the surface of the resin cured layer 20 after cutting is completed is approx. 10 μm which is preferable and the load in the next cutting step is decreased.

Then, cutting is performed by an operation same as the above cutting operation. However, a large difference lies in the fact that a grinding stone is rotated by a grinding-unit rotation driving mechanism 202 during grinding. Grinding is also divided into coarse grinding and finish grinding. The standard rotation speeds of the workpiece 70 and grinding stone range between 600 and 1300 rpm in accordance with the outer periphery length of the workpiece 70 and a predetermined feed rate for coarse grinding ranges between 1.5 and 5 m/min, a feed rate for finish grinding ranges between 0.1 and 0.5 m/min, a grinding value for coarse grinding is set to approx. 5 μm, and a grinding value for finish grinding is set to approx. 1 μm.

Ra of the surface of the resin cured layer 20 after grinded obtains a surface smoothness of approx. 1 μm which hardly influences paper printing. However, when more preferable Ra like the case of film printing is necessary, it is preferable to polish the layer 20. In the case of the polishing, Ra is improved up to approx 0.1 μm in smoothness by performing the lapping using abrasive material to which minute abrasive grains-#50000 are applied.

Moreover, it is preferable to supply polishing liquid to a grinding stone by the grinding-unit polishing-liquid injecting mechanism 204 in accordance with desired Ra. Moreover, by spraying cold blast on the grinding stone and the working surface of the resin cured layer 20 at a high speed, it is preferable to prevent polishing refuse from re-depositing on the resin cured layer 20 in addition to the cooling effect of the working face.

Then, step S12 for measuring the outer periphery length and surface temperature of the workpiece is started.

Description of this step is omitted because this step is the same as the above measuring step S5. However, processing is performed in accordance with the measured outer periphery value and measured surface temperature. When the outer periphery length of the workpiece is larger than a desired outer periphery length, it is preferable to perform the above step S11 for shaping the photosensitive resin cured layer 20 and when the outer periphery length is smaller than the desired outer periphery length, it is preferable to repeat the above step S11 for shaping the photosensitive resin cured layer 20 from the above step S7 for supplying the liquid-state photosensitive resin 10.

Then, step S13 for inspecting the surface of the resin cured layer is started.

When confirming that rotation of the workpiece 70 is completely stopped through the transparent inside view port 260, a safety cover (not illustrated) is opened to sufficiently visually check whether the shaped resin cured layer 20 has a defect while intermittently manually rotating the workpiece 70. Thereby, if a defect such as bubble is found on the surface of the photosensitive resin cured layer 20, the defect position is input through a scale (not illustrated) by the touch panel monitor 906. Thereafter, it is preferable to remove the resin cured layer 20 having the defect in the next step S14 for removing the photosensitive resin cured layer 20 as a defect repairing step and then repeat the above step S11 for shaping the photosensitive resin cured layer 20 from the above step S7 for supplying the liquid-state photosensitive resin 10.

Then, step S14 for removing the photosensitive resin cured layer 20 is started.

The workpiece 70 is rotated at a desired rotation speed (600 to 1300 rpm when outside diameter of the workpiece is 250 mm) and a removal start control signal (not illustrated) is output to the working-tool-holding-pedestal linearly moving and moving-position detecting mechanism 181 from the electronic control mechanism 900 in accordance with the laser-carving unnecessary area data calculated in the above step S3 for processing RIP image data, positions of the both ends of the workpiece 70 measured in the above step S4 for detecting an edge and stored in the memory 905, outer periphery length of the shaped workpiece measured in the above step S12 for measuring the outer periphery length and surface temperature of the workpiece and a desired applied width.

Thereby, the cutting unit 190 present at the waiting position moves from the edge of the workpiece 70 at the spindle stock-100 side to the removal start position present at a predetermined distance from the edge of the workpiece 70, is raised up to a first-time predetermined cutting position in the direction vertical to the axis center of the workpiece 70 by the cutting-unit linearly moving and moving-position detecting mechanism 191 and cutting same as coarse cutting in the shaping step of the above step S11 is started. Moreover, during cutting, it is preferable that the cutting-unit vacuum attracting mechanism 192 and cutting-unit cutting-lubricant injecting mechanism 193 operate.

When cutting for removing extra resin cured layer 20 optically cured by exceeding a desired applied width and resin cured layer in the relief image unnecessary area by a predetermined thickness are completed, workpiece 70 stops rotation and the cutting unit 190 separates from the workpiece 70, the cutting-tool-unit vacuum attracting mechanism 192 and cutting-unit cutting-lubricant injecting mechanism 193 are stopped, and the cutting unit 190 returns to the waiting state.

Thus, the resin cured layer 20 having a uniform thickness using single liquid-state photosensitive resin can be formed on the outer periphery of the workpiece 70 and a seamless printing original form plate for laser carving is obtained.

Moreover, it is preferable to laminate a plurality of photosensitive resin cured layers 20 by using at least one or more types of liquid-state photosensitive resins 10, set the corresponding liquid-state-photosensitive-resin supplying unit 140, repeat from the above step S7 for supplying the liquid-state photosensitive resin 10 up to the above step S8 for applying and smoothing the liquid-state photosensitive resin 10, the above step S8 for exposing the liquid-state photosensitive resin 10, or S11 for shaping the photosensitive resin cured layer 20.

As an example, it is possible to improve the printing quality by using two different types of the photosensitive resins 10 and forming two types of the photosensitive resin cured layers 20 having hardnesses after optically cured different from each other. In the case of the two photosensitive resin cured layers 20, it is preferable to form an upper layer having a high hardness and a thickness of approx. 0.5 mm and a lower layer having a low hardness and a thickness of approx. 2.5 mm when the thickness of the photosensitive resin cured layer 20 is 3 mm.

Moreover, at least in either of a state before the above step S7 for supplying resin and a state after the above step S8 for applying and smoothing resin, it is preferable to scrape the liquid-state photosensitive resin 10 attached to the cutting edge at the front end of the resin receiving plate 151 by a resin scraping blade unit 220.

Then, step S15 for clean wiping is started.

This step is a step to be added only when the surface of the photosensitive resin cured layer 20 is dirty. It is preferable to manually wipe the surface of the photosensitive resin cured layer 20 by a material having water holding property such as nonwoven fabric, shop cloth, or sponge containing cleaning liquid or solvent (ethanol or acetone) while manually intermittently rotating the workpiece 70.

Moreover, when it is impossible to sufficiently manually remove refuse because the surface adhesiveness of cured resin is too strong, this step is skipped and step 17 for taking out workpiece is started and then, step S18 for hot-water high-pressure cleaning is started. However, when surface adhesiveness remains after this step, it is preferable to perform post-exposure (referred to as intermediate exposure) of a relief image in step S20.

Then, step S16 for laser carving is started.

A working-tool-holding-pedestal-operation control signal 923 for moving the laser carving head 300 from the electronic control mechanism 900 and a workpiece rotation control signal 922 for rotating the workpiece 70 are output to the working-tool-holding-pedestal linearly moving and moving-position detecting mechanism 181 and workpiece-rotation driving and rotation control mechanism 120.

When the laser carving head 300 moves along the axis center direction of the workpiece 70 at a constant speed by a distance same as the fusion-melting width of the photosensitive resin cured layer 20 every turn of the workpiece 70, a relief image is formed on the photosensitive resin cured layer 20 in a spiral mode.

In this laser carving operation, the electronic control mechanism 900 performs AND operation between rotary encoder pulse information 911 for measuring the rotation angle of the workpiece 70 transmitted from the rotary encoder 130 and the bit map image data (not illustrated) transmitted from the RIP server 1000 and stored in the memory 905 and transmits the operation result to an acoustic optical modulator 370 as a relief image control signal (not illustrated) and thereby the infrared laser beam 40 applied from the infrared laser generator 360 is optically modulated.

The optical path of the infrared laser beam 40 optically modulated is changed by two sets of mirrors and the beam 40 is led to the beam expander 390. The infrared laser beam 40 whose beam diameter is expanded after passing through the beam expander 390 and the optical path of the beam 40 is changed by the mirror 310 of the laser carving head 300, passes through the lens 320, and arrives on the photosensitive resin cured layer 20.

Thus, when a relief image is formed on the entire surface of the resin cured layer 20, the laser carving head 300 returns to the waiting position. During the above laser carving operation, it is preferable that fusion-melted gas (debris) is discharged to the outside from the vacuum attracting mechanism 350 having a filter in a vacuum route by operating a vacuum pump (not illustrated).

Moreover, it is preferable to assist a vacuum attracting function by setting an air blast mechanism (not illustrated) nearby the opposite face to the vacuum attracting mechanism 350, jetting air toward the resin cured layer 20 during laser carving, and blowing away debris produced from the resin cured layer 20.

Furthermore, the description of the scanning system of the above laser carving shows a constant-speed linear moving scanning system for forming a relief image in the spiral mode while the laser carving head 300 moves in the axis center direction of the workpiece 70 at a constant speed by the same distance as a fusion-removing width of the photosensitive resin cured layer 20 every turn of the workpiece. However, as a system different from the above system, it is also possible to use an intermittent moving scanning system for repeating a step of forming a relief image in a sectional mode by moving the carving head 300 in the axis center direction of the workpiece 70 by the same distance as the fusion removing width and then, stopping the head 300, and performing laser carving while stopping the head 300.

Furthermore, when the photosensitive resin cured layer 20 in the laser carving unnecessary area is already removed by step S3 for processing image data and step S14 for removing a resin cured layer, only the laser necessary area is laser-carved by performing skip scanning in which the moving speed of the laser carving head 300 is 10 times or more faster than the speed in the laser-carving necessary area. Thereby, it is possible to greatly reduce the step time.

Furthermore, in the case of this embodiment, it is possible to control at least one of parameters for specifying a relief shape such as relief depth or shoulder angle by a manufacturing apparatus and manufacturing method described below.

First, there is a method for adjusting the amount of energy of the infrared laser beam 40 applied to the resin curd layer 20. For example, a method for controlling the rotation speed of the workpiece 70 is generally used in which to increase the amount of energy, the rotation speed of the workpiece 70 is decreased and to decrease the amount of energy, the rotation speed is increased. It is also possible to control the intensity of the infrared laser beam 40 applied by directly controlling the laser driving power supply of the infrared laser generator 360.

Moreover, when a deep relief depth exceeding several millimeters is requested, it is difficult to satisfy the request by only one time of laser carving cycle. Therefore, it is necessary to perform laser carving cycle a plurality of times.

For example, in the case of a plurality of times of cycles, the lens supporting mechanism 330 is advanced by a predetermined distance toward the outer periphery of the workpiece 70 by the focal point correcting mechanism 340 and when the lens 320 approaches the outer periphery of the workpiece 70, the focal point position of the infrared laser beam moves into the resin cured layer 20. Thereafter, the laser carving cycle same as the first time is repeated and thereby, a second-time relief image is formed by being superimposed on the case of the first time. Therefore, it is possible to increase the relief depth.

Then, step S17 for taking out workpiece is started.

Taking-out of the workpiece 70 is reverse to setting of the workpiece 70. The workpiece 70 is inserted up to the setting position of the workpiece 70 by sliding the workpiece setting pedestal 90 to release one shaft of the workpiece 70 by moving the tail stock 110. Then, by releasing the chuck of the spindle stock 100, the workpiece 70 is removed from the rotation-driving and rotation-control mechanism 120 to become a state in which the workpiece 70 is mounted on the workpiece setting pedestal 90 and the step is completed by bringing out the setting pedestal 90.

Then, step S18 for hot-water high-pressure (steam) cleaning is started.

When the workpiece 70 taken out from this manufacturing apparatus is set to the workpiece holding and rotating mechanism 450 of the hot-water high-pressure cleaning unit 400 and starts rotation in the direction of the arrow A shown in FIG. 7, the high-pressure plunger pump 460 stars operation. The cleaning liquid 50 heated up to a predetermined temperature in the cleaning liquid tank 430 is attracted by the high-pressure plunger pump 460 and heated up to a temperature exceeding 100° C. according to necessity while passing through the high-pressure heating heater 510 in a state in which a high pressure is applied and supplied to the nozzle header 470.

The cleaning liquid 50 supplied to the nozzle header 470 is jetted to a laser-carved relief image layer of the workpiece 70 from the jet orifice of the nozzle 480 in an atomized or uniformed state. The cleaning liquid 50 spouted from the spraying nozzle 480 collides with the relief image layer of the workpiece 70 and then, resin refuse produced on the relief image layer is removed in the above step S16 for laser carving through a nonwoven filter 560 and returns into the cleaning liquid tank 430 again.

Moreover, the cleaning liquid 50 is attracted into the high-pressure plunger pump 460 through the supplying pipe 490 connected to the cleaning liquid tank 430 and circularly used. Then, the remaining cleaning liquid 50 is blown away by opening the pneumatic electromagnetic valve 540 and spraying the pressure air supplied from a compressor on the resin cured layer 20 by the draining nozzle 520 and then, the switching door 420 is opened to remove the workpiece 70 from the workpiece holding and rotating mechanism 450 and take out the workpiece 70 from the treating bath 410.

It is possible to remove powder-state or liquid-state refuse produced on the resin cured layer 20 in the above step S16 for laser carving by spraying the cleaning liquid 50 having a pressure between 0.2 and 30 MPa (both included) and a temperature between 40 and 140° C. (both included) on the photosensitive cured layer 20 in water-jet mode or steam mode.

Particularly, this is effective because it is possible to raise the viscous liquid-state refuse from the surface of the resin cured layer 20 by hot water or steam. When the pressure of the hot water or steam is 0.2 MPa or higher, removal of powder-state refuse is sufficient. When the pressure is 30 MPa or lower, it is possible to remove the refuse without destroying a minute image pattern.

Moreover, when the temperature of the cleaning liquid 50 is 40° C. or higher, it is possible to sufficiently raise the viscous liquid-state refuse from the surface of the resin cured layer 20 and reduce the number of tacks on the surface of a form plate. Furthermore, when the temperature is 140° C. or lower, it is possible to restrain thermal damage on the resin cured layer 20.

Furthermore, it is preferable that gas or abrasive material is mixed in order to raise the cleaning efficiency.

Then, step S19 for setting workpiece is started. However, description is omitted because the same thing as the above step S2 for setting workpiece is repeated.

Then, step S20 for post-exposing relief image is started.

The post-exposing step is performed to improve the physical property as a relief printing form plate of a relief image layer of the workpiece 70 and remove surface adhesiveness. The post-exposing step is treated by the same method using the exposing unit 170 similarly to the above step S9 for exposure. However, a proper post-exposing value for obtaining a sufficient surface adhesiveness removal effect depends on the composition of photosensitive resin, type of photosensitive hydrogen extracting agent, or content of photosensitive hydrogen extracting agent to resin composition. Therefore, at least 500 ml/cm$^2$ is necessary and it is preferable to normally perform post-exposure in a range between 1000 and 10000 ml/cm$^2$. Extra post-exposing value of 10000 ml/cm or more is not preferable because a delicate crack is produced on the surface of a form plate.

Evaluation of the adhesiveness of the surface of a printing form plate can be performed by a tack tester (produced by TOYO SEIKI) for reading an adhesive strength by a push-pull gauge when an aluminum ring gets away from the surface of a relief of a printing form plate by putting a weight of 500 g on the aluminum ring and leaving it as it is for 4 sec and then raising the aluminum ring at a speed of 30 mm/min while an object obtained by winding a polyethylene film on the surface of the circumferential portion of a ring having a diameter of 50 mm constituted of an aluminum wire having a diameter of 13 mm is put on the relief surface.

It can be said that a printing form plate has less surface adhesiveness when it has smaller value of a tack tester (hereafter referred to as a tack value). A printing form plate having a tack value exceeding 50 g causes a trouble on the printing form plate because foreign matter attaches to the surface of the printing form plate. In the case of a printing from plate having a tack value exceeding 100 g, when printing form plates are superimposed, the form plates are glued. When an object to be printed is paper, a phenomenon of paper peeling easily occurs due to adhesion between printing-form-plate surface and paper. When a tack value is 30 g or less, it is considered that a problem due to adhesion does not occur in practical use. A liquid-state photosensitive relief having a particularly large adhesion among printing form plates generally has a tack value exceeding 100 g when any treatment for removing surface adhesion is not applied.

Then, step S21 for modifying and drying surface of relief image is started.

This step is an option step when sufficient improvement of physical property and surface adhesion removal effect cannot be obtained in the above step S20 for post-exposure, which is a step omitted when optimally designing the type of photosensitive hydrogen extracting agent and the content of the photosensitive hydrogen extracting agent to resin composition.

As the operation of the surface modifying and drying step, the surface modifying unit 230 is raised by elevating means (not illustrated) by pneumatic driving from the waiting state and kept in a state of contacting with the relief image layer of the workpiece 70. Thereafter, while rotating the workpiece 70, the surface modifying agent 60 housed in the surface-modifying-agent housing tank 231 is transferred to the applying roller 233 through the dipping roller 232 in accordance with the rotation of the dipping roller 232. Thereby, the surface modifying agent 60 is applied to the entire surface of the photosensitive resin cured layer 20.

When the above application is completed, the surface modifying unit 230 is lowered by the elevating means. Moreover, it is preferable to forcibly dry the surface modifying agent 60 applied to the photosensitive resin cured layer 20 and decrease the step time by turning on the heating heater 242.

Then, step S22 for taking out workpiece is started. However, description of step S22 is omitted because the same thing as the above step S17 for taking out workpiece is repeated.

Moreover, the liquid-state photosensitive resin 10 uses resin superior in direct carving property by an infrared laser after optically cured. Therefore, it is possible to easily form a relief image on an original form plate for seamless printing manufactured by an embodiment of the present invention by laser direct carving which is a dry technique.

INDUSTRIAL APPLICABILITY

By using a method and an apparatus for manufacturing the relief material for seamless printing, it is possible to uniform and smooth an applied thickness because the applied thickness can be shaped by a front-end cutting edge while supplying liquid-state photosensitive resin having a viscosity capable of holding an applied shape without being influenced by gravity and centrifugal force by rotation to a resin receiving plate at a desired applied width in linear mode by resin supplying means, rotating a workpiece, and applying the liquid-state photosensitive resin to the outer periphery of the workpiece.

Moreover, it is possible to improve the printing reasonableness of a photosensitive resin cured layer by high-intensity ultraviolet exposure. Moreover, because of shaping the surface of the photosensitive resin cured layer, it is possible to easily manufacture a relief material for seamless printing (also referred to as original form plate for seamless printing) having a high-accuracy thickness and a preferable surface smoothness.

Therefore, it is possible to manufacture a relief material for seamless printing having a high printing reasonableness by preferable surface smoothness and completely free from seam, improve the operability by requiring no conventional negative film manufacturing step or solution developer step, save resources, and maintain environment.

The invention claimed is:

1. A method for manufacturing a relief material for seamless printing using a liquid-state photosensitive resin, the method comprising:

setting a workpiece using either of a printing cylinder or a printing sleeve, which is integrally supported by a metallic mandrel, to a holding and rotating device for holding and rotating the workpiece;

supplying a liquid-state photosensitive resin having a viscosity that retains an applied shape without being influenced by gravity or centrifugal force due to rotation, to a resin receiving plate which has an angle of inclination and whose front end has a doctor blade shape from a resin supplying device in a linear mode by linearly moving the resin supplying device in an axial direction of the workpiece, at least one end of the resin receiving plate in the axial direction having a resin flow preventive movable dam that is linearly movable in the axial direction of the workpiece;

applying the liquid-state photosensitive resin supplied to the resin receiving plate to an outer periphery of the workpiece at an applied thickness with the front-end of the resin receiving plate while rotating the workpiece; and exposing high-intensity ultraviolet light to the liquid-state photosensitive resin applied to the outer periphery of the workpiece while rotating the workpiece to form a photosensitive resin cured layer by optically curing the liquid-state photosensitive resin so that it can be carved by an infrared laser beam.

2. The method according to claim 1, further comprising shaping the surface of the photosensitive resin cured layer.

3. The method according to claim 1, wherein the viscosity of the liquid-state photosensitive resin supplied ranges from 6 to 50 kPa·s at 20° C. and the ultraviolet light in the exposing step has a wavelength area of from 200 to 400 nm and an ultraviolet intensity of 10 mW/cm$^2$ or more.

4. The method according to claim 1, wherein in the supplying step, the liquid-state photosensitive resin is supplied to the resin receiving plate from at least one or more resin supplying nozzles of the resin supplying device.

5. The method according to claim 1, wherein the liquid-state photosensitive resin is applied to the outer periphery of the workpiece at a desired thickness while gradually expanding a gap between the front-end of the resin receiving plate and the outer periphery of the workpiece by moving the resin receiving plate vertically relative to the axis of the workpiece in the applying step.

6. The method according to claim 1, wherein the supplying step is performed a plurality of times.

7. The method according to claim 1, further comprising a first removing step for removing extra cured photosensitive resin from the cured layer that exceeds a desired width in the exposing step to a desired thickness in parallel with or after a shaping step.

8. The method according to claim 7, further comprising a carving step for fusion-removing cured photosensitive resin from the cured layer by rotating the workpiece while linearly-moving a laser carving device for carving the photosensitive resin cured layer on the outer periphery of the workpiece in an axial direction of the workpiece and focusing one or more infrared laser beams applied from the laser carving device on the photosensitive resin cured layer in accordance with the control of a digital image recording signal after either of the shaping step or the first removing step.

9. The method according to claim 8, further comprising a second removing step for removing cured photosensitive resin from the cured layer in an area in which formation of a relief image in the carving step is unnecessary to a desired thickness in parallel with or after the shaping step.

10. The method according to claim 9, wherein in the second removing step, only a relief image forming area is laser carved by performing interlaced scanning for moving the laser carving device at a high speed in an image unnecessary area in the carving step when the photosensitive resin cured layer in the area in which formation of the relief image is unnecessary is removed to a desired thickness.

11. The method according to claim 8, further comprising a cleaning step for cleaning the photosensitive resin cured layer with a cleaning device for spraying cleaning fluid having a pressure of from 0.2 to 30 MPa and a temperature of from 40 to 140° C. onto the cured layer after any one of the carving step, removing step, and shaping step.

12. The method according to claim 8, further comprising a post-exposing step for applying ultraviolet light to a relief image layer on the outer periphery of the workpiece while rotating the workpiece after either of the carving step or cleaning step.

13. The method according to claim 12, further comprising a surface modifying step for applying a surface modifying agent to the relief image layer for modifying the surface of the relief image layer of the workpiece while rotating the workpiece and then drying the agent.

14. The method according to claim 13, wherein in the surface modifying step forcible heating and drying is performed while applying the surface modifying agent to the relief image layer.

15. The method according to claim 1, wherein the angle of inclination is an angle of from 15 to 75°.

16. The method according to claim 1, wherein the applied thickness ranges from 0.5 to 3 mm.

17. The method according to claim 1, wherein the resin supplying device includes a resin supplying nozzle.

18. The method according to claim 17, wherein the linear mode is a mode in which the resin supplying nozzle supplies the liquid-state photosensitive resin to the resin receiving plate while the resin supplying nozzle linearly moves in an axial direction of the workpiece.

19. The method according to claim 1, further comprising a carving step for fusion-removing cured photosensitive resin from the cured layer by rotating the workpiece while linearly-moving a laser carving device for carving the photosensitive resin cured layer on the outer periphery of the workpiece in an axial direction of the workpiece and focusing one or more infrared laser beams applied from the laser carving device on the photosensitive resin cured layer in accordance with the control of a digital image recording signal after either of a shaping step or a first removing step.

* * * * *